United States Patent
Saido et al.

(10) Patent No.: US 11,495,477 B2
(45) Date of Patent: *Nov. 8, 2022

(54) SUBSTRATE PROCESSING APPARATUS

(71) Applicant: Kokusai Electric Corporation, Tokyo (JP)

(72) Inventors: Shuhei Saido, Toyama (JP); Hidenari Yoshida, Toyama (JP); Takatomo Yamaguchi, Toyama (JP); Takayuki Nakada, Toyama (JP); Tomoshi Taniyama, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/138,383

(22) Filed: Sep. 21, 2018

(65) Prior Publication Data

US 2019/0035654 A1    Jan. 31, 2019

Related U.S. Application Data

(62) Division of application No. 15/227,602, filed on Aug. 3, 2016, now Pat. No. 10,615,061.

(30) Foreign Application Priority Data

Aug. 4, 2015 (JP) ................................ 2015-154393
Jun. 6, 2016 (JP) ................................ 2016-112738

(51) Int. Cl.
*H01L 21/67*      (2006.01)
*C23C 16/46*      (2006.01)
(Continued)

(52) U.S. Cl.
CPC .... *H01L 21/67109* (2013.01); *C23C 16/4408* (2013.01); *C23C 16/4412* (2013.01);
(Continued)

(58) Field of Classification Search
CPC ......... H01L 21/67109; H01L 21/68792; H01L 21/67017; C23C 16/4584;
(Continued)

(56) References Cited

U.S. PATENT DOCUMENTS 5,062,386 A * 11/1991 Christensen ........ C23C 16/4411
                                                          118/715
5,478,397 A * 12/1995 Shibata ................. C23C 16/455
                                                          118/724
(Continued)

FOREIGN PATENT DOCUMENTS

JP        07122512 A  *  5/1995
JP        07297179 A     11/1995
(Continued)

OTHER PUBLICATIONS

English Machine Translation of Horie et al. JP2002222806A retrieved from ESPACENET Aug. 3, 2021 (Year: 2021).*
(Continued)

*Primary Examiner* — Ram N Kackar
*Assistant Examiner* — Laureen Chan
(74) *Attorney, Agent, or Firm* — Edell, Shapiro & Finnan, LLC

(57) ABSTRACT

Provided is a technique in which a heating-up time inside a process chamber is reduced. The technique includes a substrate processing apparatus including a process chamber where a substrate is processed, a substrate retainer configured to support the substrate in the process chamber, a process gas supply unit configured to supply a process gas into the process chamber, a first heater installed outside the process chamber and configured to heat an inside of the process chamber, a thermal insulating unit disposed under the substrate retainer, a second heater disposed in the thermal insulating unit and configured to heat the inside of the (Continued)

process chamber, and a purge gas supply unit configured to supply a purge gas into the thermal insulating unit to purge an inside of the thermal insulating unit.

16 Claims, 17 Drawing Sheets

(51) Int. Cl.
| | |
|---|---|
| C23C 16/44 | (2006.01) |
| C23C 16/455 | (2006.01) |
| C23C 16/458 | (2006.01) |
| H01L 21/687 | (2006.01) |

(52) U.S. Cl.
CPC .... *C23C 16/4584* (2013.01); *C23C 16/45546* (2013.01); *C23C 16/46* (2013.01); *H01L 21/67017* (2013.01); *H01L 21/68792* (2013.01)

(58) Field of Classification Search
CPC .......... C23C 16/45546; C23C 16/4408; C23C 16/4412; C23C 16/46; C23C 16/4587; F27B 17/0025
See application file for complete search history.

(56) References Cited

U.S. PATENT DOCUMENTS

| | | | |
|---|---|---|---|
| 6,444,940 B1* | 9/2002 | Saito | H01L 21/67109 219/390 |
| 2003/0183614 A1* | 10/2003 | Yamaguchi | C30B 31/10 219/390 |
| 2004/0025786 A1* | 2/2004 | Kontani | C23C 16/45578 118/715 |
| 2004/0149227 A1 | 8/2004 | Saito et al. | |
| 2005/0121145 A1 | 6/2005 | Du Bois et al. | |
| 2005/0269031 A1 | 12/2005 | Tyler et al. | |
| 2008/0173238 A1 | 7/2008 | Nakashima et al. | |
| 2009/0016854 A1 | 1/2009 | Morohashi et al. | |
| 2009/0181548 A1 | 7/2009 | Takahashi et al. | |
| 2009/0305512 A1* | 12/2009 | Matsuura | C23C 16/45525 438/758 |
| 2010/0035437 A1* | 2/2010 | Yamazaki | F16L 25/00 438/758 |
| 2010/0055351 A1* | 3/2010 | Kato | C23C 16/45521 427/595 |
| 2010/0263594 A1 | 10/2010 | Na et al. | |
| 2011/0201210 A1 | 8/2011 | Sato et al. | |
| 2011/0226739 A1 | 9/2011 | Allen et al. | |
| 2011/0303152 A1* | 12/2011 | Asari | H01L 21/67309 118/728 |
| 2012/0094010 A1 | 4/2012 | Sugiura et al. | |
| 2012/0214317 A1* | 8/2012 | Murabayashi | C23C 16/325 438/782 |
| 2013/0017503 A1 | 1/2013 | De Ridder et al. | |
| 2013/0042803 A1* | 2/2013 | Saido | C23C 16/45578 117/88 |
| 2014/0087565 A1* | 3/2014 | Yamaguchi | C23C 16/4401 438/758 |
| 2014/0256152 A1* | 9/2014 | Ogawa | H01L 21/02189 438/758 |
| 2014/0287595 A1 | 9/2014 | Shimamoto et al. | |
| 2016/0024654 A1 | 1/2016 | Fukushima et al. | |
| 2016/0233085 A1 | 8/2016 | Yamaguchi et al. | |
| 2017/0022610 A1* | 1/2017 | Seo | C23C 16/45546 |
| 2018/0090322 A1* | 3/2018 | Jung | H01L 21/02 |

FOREIGN PATENT DOCUMENTS

| | | |
|---|---|---|
| JP | 2000-243701 A | 9/2000 |
| JP | 2000243701 A * | 9/2000 |
| JP | 2001-196364 | 7/2001 |
| JP | 2002222806 A * | 8/2002 |
| JP | 2003-197545 | 7/2003 |
| JP | 2003-218040 A | 7/2003 |
| JP | 2003218040 A * | 7/2003 |
| JP | 2007-217762 A | 8/2007 |
| JP | 2007-299776 | 11/2007 |
| JP | 2008-258207 | 10/2008 |
| JP | 2013-021336 | 1/2013 |
| JP | 2014-67783 A | 4/2014 |
| JP | 2014-175494 A | 9/2014 |
| KR | 10-2008-0054354 | 6/2008 |
| KR | 10-2010-0114717 | 10/2010 |
| TW | 201140695 A1 | 11/2011 |
| TW | 201230229 A1 | 7/2012 |
| TW | 201448038 A | 12/2014 |
| TW | 201513219 A1 | 4/2015 |

OTHER PUBLICATIONS

English Machine Translation of Haribuchi JPH07122512A retrieved from ESPACENET Aug. 4, 2021 (Year: 2021).*
Office Action issued in corresponding Japanese Patent Application No. 2016-112738, dated Jul. 1, 2019, with English translation.
Office Action in corresponding Korean Patent Application No. 10-2016-0095160, dated Aug. 17, 2017, with English translation.
Office Action in corresponding Taiwan Patent Application No. 106140989, dated Jun. 28, 2018, with English translation.
Office Action issued in corresponding U.S. Appl. No. 15/928,986, dated Oct. 31, 2019.

* cited by examiner

SUBSTRATE PROCESSING APPARATUS

CROSS REFERENCE TO RELATED APPLICATIONS

This application is a divisional of U.S. patent application Ser. No. 15/227,602 filed Aug. 3, 2016, which claims foreign priority under 35 U.S.C. § 119 of Japanese Patent Application No. 2015-154393, filed on Aug. 4, 2015 and Japanese Patent Application No. 2016-112738, filed on Jun. 6, 2016, the entire contents of which are hereby incorporated by reference.

TECHNICAL FIELD

The present disclosure relates to a substrate processing apparatus.

BACKGROUND

A substrate processing apparatus such as a vertical substrate processing apparatus is used for heat treatment of a substrate in a process of manufacturing a semiconductor device. A predetermined number of substrates are arranged in a vertical direction and supported by a substrate retainer of a vertical substrate processing apparatus and the substrate retainer is loaded into a process chamber of the vertical substrate processing apparatus. Then, as a process gas is introduced into the process chamber with the substrate heated by a heater which is provided outside the process chamber, substrate processing such as processing of forming a thin film on the substrate is performed.

In a conventional vertical substrate processing apparatus, there is a problem in that heat is likely to leak through a lower portion of a process chamber. Specifically, there is a problem in that a lot of time is required for heating a substrate disposed on the lower portion of the process chamber to a processing temperature.

SUMMARY

Described herein is a technique in which a heating-up time of a process chamber is reduced.

According to an aspect, there is provided a technique including a substrate processing apparatus including a process chamber where a substrate is processed, a substrate retainer configured to support the substrate in the process chamber, a process gas supply unit configured to supply a process gas into the process chamber, a first heater installed outside the process chamber and configured to heat an inside of the process chamber, a thermal insulating unit disposed under the substrate retainer, a second heater disposed in the thermal insulating unit and configured to heat the inside of the process chamber, and a purge gas supply unit configured to supply a purge gas into the thermal insulating unit to purge an inside of the thermal insulating unit.

DETAILED DESCRIPTION

A first embodiment will be described with reference to FIGS. 1 through 3.

Figure 1:
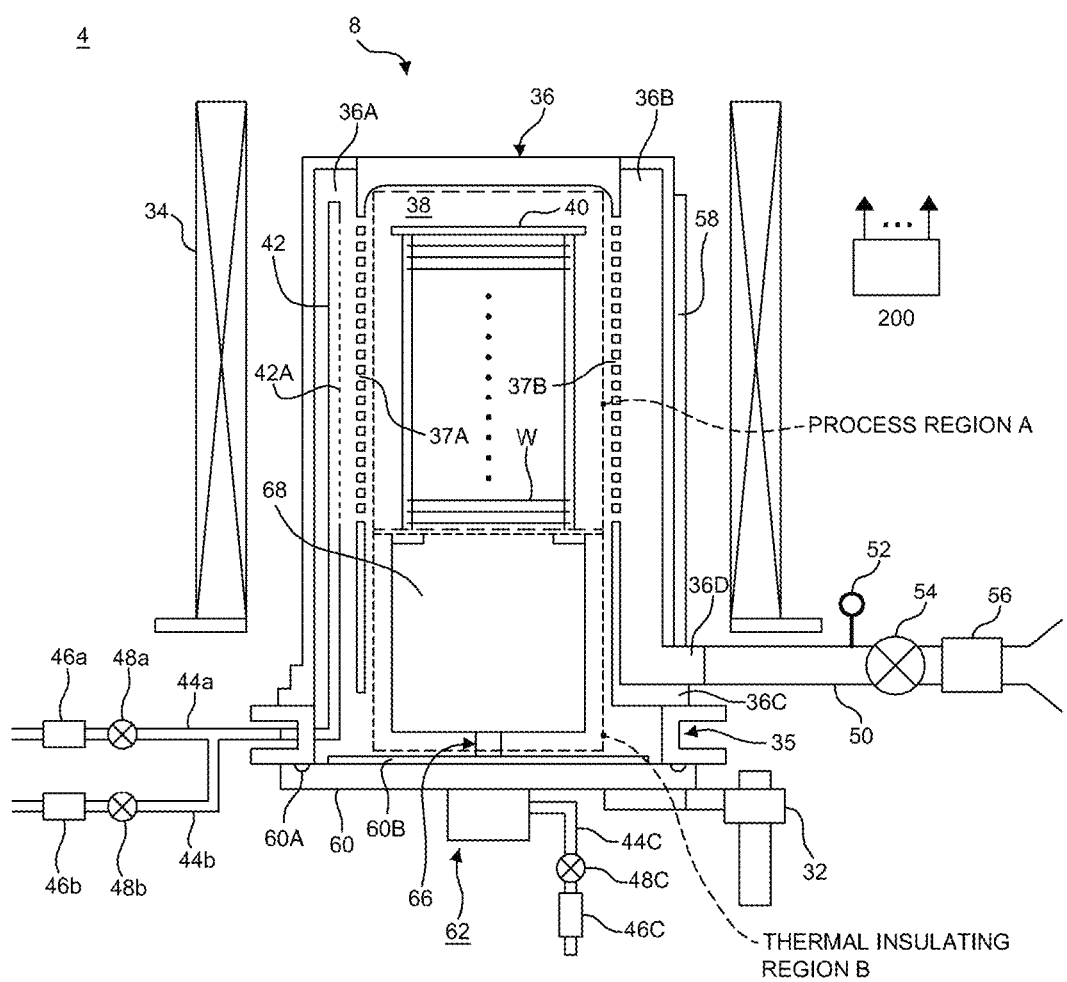
FIG. 1 is a vertical cross-sectional view schematically illustrating a processing furnace of a substrate processing apparatus preferably used in a first embodiment described herein.

As illustrated in FIG. 1, a substrate processing apparatus in the first embodiment is a vertical heat treatment apparatus 4 (substrate processing apparatus) in which a heat treatment process in a manufacturing method of an integrated circuit (IC) is performed. A processing furnace 8 includes a heater 34 serving as a first heater. The heater 34 has a cylindrical shape, is vertically provided, and is supported by a heater base (not illustrated). As described below, the heater 34 may operate as an activation mechanism (excitation unit) for activating (exciting) a gas by heat.

A reaction tube 36 constituting a reaction container (process container) is provided inside the heater 34. The reaction tube 36 is formed of a heat-resistant material such as quartz (SiO₂) and silicon carbide (SiC) and has a cylindrical shape having an upper end that is closed and a lower end that is opened. A gas supply space 36A and a gas exhaust space 36B protrude toward an outside of the reaction tube 36 so as to face each other on the outside of the reaction tube 36. A flange 36C protrudes toward the outside of the reaction tube 36 on the lower end of the reaction tube 36. The reaction tube 36 is supported by a cylindrical metal manifold 35 which is provided thereunder. A process chamber 38 is defined by the reaction tube 36. A wafer W serving as a substrate is accommodated in the process chamber 38 by a boat 40 to be described below. The process chamber 38, the gas supply space 36A and the gas exhaust space 36B are divided by partitions. A diameter of the manifold 35 is greater than that of an inner wall of the reaction tube 36 [a diameter of the flange 36C]. An annular space to be described below is provided between the lower end [flange 36C] of the reaction tube 36 and a seal cap 60 to be described below.

A nozzle 42 is provided in the gas supply space 36A. A gas supply pipe 44a is connected to the nozzle 42. A mass flow controller (MFC) 46a serving as a flow rate controller and a valve 48a serving as an opening and closing valve are sequentially provided in the gas supply pipe 44a from an upstream side to a downstream side. A gas supply pipe 44b which supplies an inert gas is connected to a downstream side of the valve 48a of the gas supply pipe 44a. An MFC 46b and a valve 48b are sequentially provided in the gas supply pipe 44b from an upstream side to a downstream side. A process gas supply unit serving as a process gas supply system includes the gas supply pipe 44a, the MFC 46a and the valve 48a.

The nozzle 42 is vertically provided in the gas supply space 36A from a lower portion of the reaction tube 36 toward an upper portion thereof [in a direction in which the wafers W are stacked]. Gas supply holes 42A which supply a gas are provided on a side surface of the nozzle 42. The gas supply holes 42A may be opened toward a center of the reaction tube 36 and the gas may be supplied toward the wafer W through the gas supply holes 42A. A plurality of laterally long supply slits 37A are provided in a direction perpendicular to partitions between the gas supply space 36A and the process chamber 38 so as to correspond to the gas supply holes 42A and the wafer W.

A plurality of laterally long gas exhaust slits 37B serving as a first exhaust unit (first exhaust ports) are provided in a direction perpendicular to partitions between the gas exhaust space 36B and the process chamber 38 so as to correspond to the supply slits 37A. An exhaust port 36D communicates with the gas exhaust space 36B and is provided in the lower end of the reaction tube 36. An exhaust pipe 50 exhausts an inner atmosphere of the process chamber 38 and is connected to the exhaust port 36D. A vacuum pump 56 serving as a vacuum exhaust apparatus is connected to the exhaust pipe 50 through a pressure sensor 52 serving as a pressure detector (pressure detecting unit) which detects an inner pressure of the process chamber 38 and an auto pressure controller (APC) valve 54 serving as a pressure regulator (pressure regulating unit). The inside of the process chamber 38 may be vacuum exhausted or the vacuum exhaustion may be stopped by opening and closing the APC valve 54 with the vacuum pump 56 in operation. The inner pressure of the process chamber 38 may be adjusted by adjusting a degree of opening of the valve based on pressure information detected by the pressure sensor 52 with the vacuum pump 56 in operation. An exhaust system includes the exhaust pipe 50, the APC valve 54 and the pressure sensor 52. The exhaust system may further include the vacuum pump 56.

The seal cap 60 serving as a furnace port cover capable of air-tightly sealing a lower opening of the manifold 35 is provided below the manifold 35. The seal cap 60 is formed of a metal such as SUS or stainless steel and has a disk shape. O rings 60A serving as seal members that abut a lower end of the manifold 35 are provided on an upper surface of the seal cap 60. A seal cap plate 60B which protects the seal cap 60 is provided on the upper surface of the seal cap 60 formed inner than the O rings 60A. The seal cap plate 60B is formed of a heat-resistant material such as quartz and SiC and has a disk shape.

The seal cap 60 is vertically moved upward and downward by a boat elevator 32 serving as a lifting mechanism (transfer mechanism) which is provided vertically outside of the reaction tube 36. That is, the boat elevator 32 may move the seal cap 60 upward and downward, and the boat 40 and the wafer W may be loaded into or unloaded from the process chamber 38 by moving the seal cap 60 upward and downward.

The boat 40 serving as a substrate retainer supports a plurality of wafers W on multiple stages, for example, 25 to 200 wafers W, that are vertically arranged in a horizontal posture while centers thereof are aligned. That is, the boat 40 is configured to support the plurality of wafers W at intervals. The boat 40 is formed of a heat-resistant material such as quartz and SiC.

A thermal insulating unit 68 to be described below is provided below the boat 40. An inside of the thermal insulating unit 68 is configured to be purged with a purge gas.

A temperature detector 58 is provided at an outer wall of the reaction tube 36. A temperature in the process chamber 38 becomes a desired temperature by adjusting power supply to the heater 34 based on temperature information detected by the temperature detector 58.

A rotation mechanism 62 which rotates the boat 40 is provided at a position opposite to the process chamber 38 of the seal cap 60. As illustrated in FIG. 2, the rotation mechanism 62 includes a housing 62A which has a substantially cylindrical shape having an upper end that is opened and a lower end that is closed. The housing 62A is disposed below the seal cap 60. A slender, long and cylindrical inner shaft 62B is disposed inside the housing 62A. An outer shaft 62C having a cylindrical shape of which a diameter is greater than an outer diameter of the inner shaft 62B is disposed inside the housing 62A. A pair of inner bearings 62D and 62E are provided between the outer shaft 62C and the inner shaft 62B down and up, and a pair of outer bearings 62F and 62G are provided between the outer shaft 62C and the housing 62A down and up. The outer shaft 62C may rotate.

Magnetic fluid seals 62H and 62I are provided in the inner bearing 62D and the outer bearing 62F, respectively. A cap 62J which seals a lower end of the outer shaft 62C is fixed to a lower surface of a closed wall of the housing 62A. A worm wheel 62K is fixed between the outer bearing 62F and the outer bearing 62G of an outer circumference of the outer shaft 62C. A worm shaft 62M which is driven to rotate by an electric motor 62L is engaged with the worm wheel 62K.

A subheater 64 is a second heater which heats the wafer W from below inside the process chamber 38 and is inserted into the inner shaft 62B so as to vertically pass therethrough. The subheater 64 includes a pillar 64A which vertically extends and a heating unit 64B which is horizontally connected to the pillar 64A. The pillar 64A is supported by a support member 62N formed of a heat-resistant resin at an upper end position of the inner shaft 62B. A lower end of the pillar 64A is supported by a support member 62P serving as a joint for vacuum through the O rings at a position lower than that of the lower surface of the closed wall of the housing 62A.

The heating unit 64B has substantially a ring shape having a diameter smaller than an outer diameter of the wafer W, and is connected to and supported by the pillar 64A so as to be parallel to the wafer W. A heater wire constituting a heating element 64C which is a coil-shaped resistance heating element is enclosed inside the heating unit 64B. The heating element 64C is formed of a material such as a Fe—Cr—Al alloy and molybdenum disilicide.

A cylindrical rotary shaft 66 includes a flange at a lower end thereof and is fixed to an upper surface of the outer shaft 62C. The subheater 64 passes through a center of a through-hole formed in the rotary shaft 66. A disk-shaped base member 70 includes a through-hole at a center thereof and is fixed to an upper end of the rotary shaft 66 at a predetermined interval $h_1$ with the seal cap plate 60B. The interval $h_1$ preferably ranges from 2 mm to 10 mm. In a case in which the interval $h_1$ is smaller than 2 mm, when the boat is rotated, the members are in contact with each other or conductance is lowered, and thus an exhaust rate of a gas inside a cylinder 74 to be described below may be reduced. When the interval $h_1$ is greater than 10 mm, a large amount of process gas may penetrate into the cylinder 74.

The base member 70 is formed of a metal such as stainless steel. A support member 72 which fixes a thermal insulating member 76 and the cylinder 74 are placed on an upper surface of the base member 70. The thermal insulating unit 68 includes the base member 70, the support member 72, the cylinder 74 and the thermal insulating member 76. The cylinder 74 has a cylindrical shape having an upper end that is closed, which may accommodate the subheater 64 therein. As illustrated in FIG. 3, in a top view, an exhaust hole 70A, which exhausts an inside of the cylinder 74 and has a diameter $h_2$, is provided in a region between the support member 72 and the cylinder 74. A plurality of exhaust holes 70A are concentrically provided in, for example, an outer portion of the base member 70 with an equal interval. The diameter $h_2$ preferably ranges from 10 mm to 40 mm. When the diameter $h_2$ is smaller than 10 mm, conductance is lowered and thus the exhaust rate of the gas from the cylinder 74 may be reduced. When the diameter $h_2$ is greater than 40 mm, a load-bearing strength of the base member 70 is reduced and thus the base member 70 may be damaged.

Figure 2:
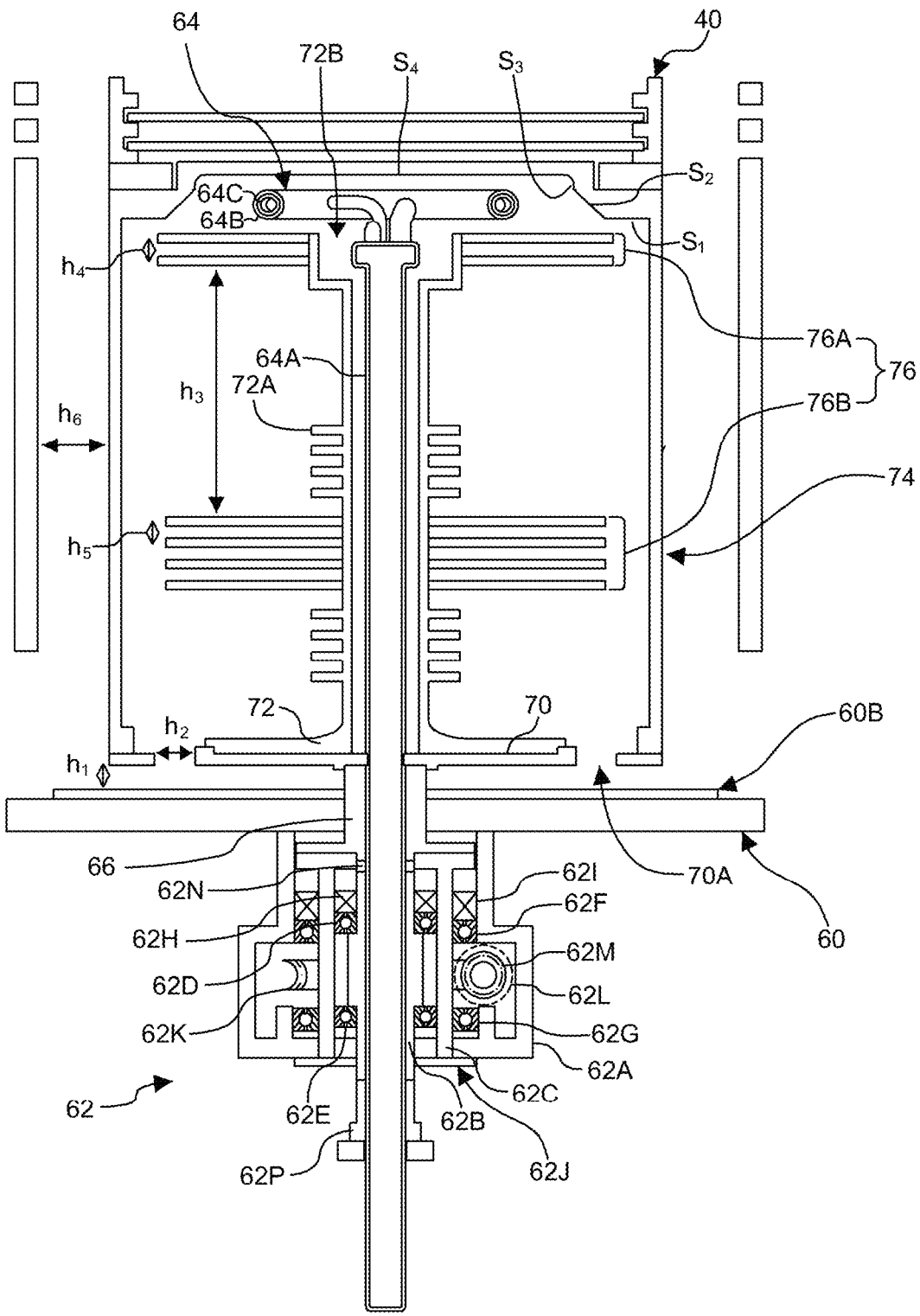
FIG. 2 is a vertical cross-sectional view schematically illustrating a thermal insulating unit of the substrate processing apparatus preferably used in the first embodiment described herein.
Figure 3:
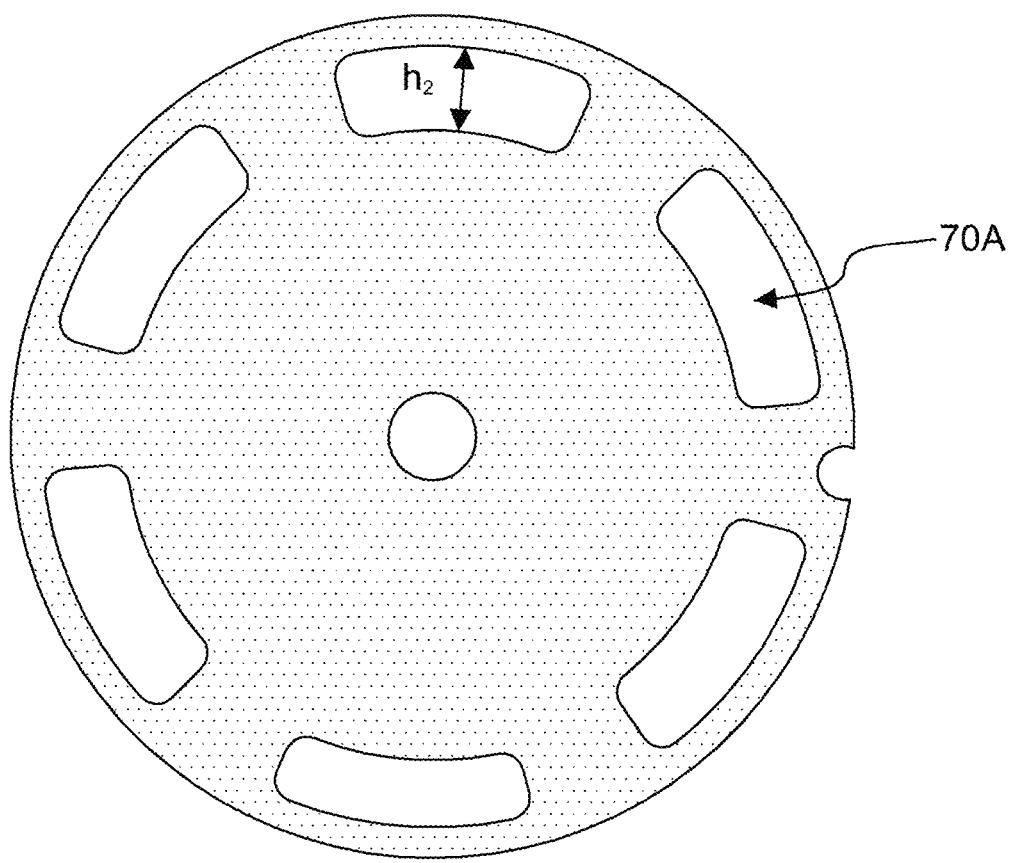
FIG. 3 is a top view illustrating a base member of the substrate processing apparatus preferably used in the first embodiment described herein.

As illustrated in FIG. 2, the support member 72 has a cylindrical shape with a through-hole at the center thereof penetrated by the subheater 64. A lower end of the support member 72 has an outward flange shape having an outer diameter smaller than a diameter of the base member 70. An upper end of the support member 72 has a diameter greater than a diameter of a pillar portion between the upper end and the lower end and constitutes a supply port 72B of the purge gas. A diameter of the through-hole is greater than that of an outer wall of the pillar 64A of the subheater 64. A first flow path serving as an annular space is a purge gas supply path which supplies a purge gas into the thermal insulating unit 68. The first flow path is provided between the support member 72 and the pillar 64A.

The support member 72 is formed of a heat-resistant material such as quartz and SiC. A surface of the support member 72, which is connected to a flange at the lower end of the support member 72 and the pillar, is a curved surface. When the connection surface is a curved surface, the strength of the support member 72 may be increased by suppressing the stress from being concentrated on the connection surface. It is preferable that the connection surface is a smooth curved surface so as not to interfere with the flowing of the purge gas. Therefore, the purge gas may be suppressed from stagnating in the cylinder 74.

In a top view, the annular space is provided between an inner wall of the support member 72 and the outer wall of the pillar 64A. As illustrated in FIG. 1, a gas supply pipe 44c is connected to the annular space. An MFC 46c and a valve 48c are sequentially provided in the gas supply pipe 44c from an upstream side to a downstream side. A purge gas supply unit serving as a purge gas supply system includes the gas supply pipe 44c, the MFC 46c and the valve 48c. As illustrated in FIG. 2, an upper end of the annular space is the supply port 72B. A purge gas is supplied to an upper portion of an inside of the cylinder 74 through the supply port 72B. As the supply port 72B is a ring-shaped opening, the purge gas may be uniformly supplied over an upper end of the cylinder 74 and a whole circumference direction of a ring-shaped radial direction. When a diameter of the supply port 72B is greater than that of the pillar portion, the purge gas may be widely supplied in the radial direction of the inside of the cylinder 74 and toward an upper space of the inside of the cylinder 74. Thus, as the inside of the cylinder 74, specifically, the vicinity of the upper end (ceiling portion) in which the heating unit 64B is provided is actively purged with the purge gas, the heating unit 64B may be suppressed from being exposed to the process gas. The purge gas supplied through the supply port 72B is exhausted from the cylinder 74 via a second flow path serving as a space between the support member 72 and an inner wall of the cylinder 74.

A reflective plate 76A and a thermal insulation plate 76B constituting the thermal insulating member 76 are provided on the pillar of the support member 72. The reflective plate 76A is fixedly attached by welding to, for example, an upper portion of the support member 72. The thermal insulation plate 76B is fixedly attached by welding to, for example, a middle portion of the support member 72. Support shelves 72A are provided on the support member 72 above and below the thermal insulation plate 76B. The support shelves 72A outwardly and horizontally extend from an outer wall of the pillar portion of the support member 72 toward thereoutside. With such a configuration, the support shelves 72A are fixed to the pillar portion of the support member 72 while centers of the support shelves 72A are aligned with a center of the thermal insulation plate 76B. An interval $h_3$ is provided between the reflective plate 76A and the thermal insulation plate 76B. The interval $h_3$ preferably ranges from 100 mm to 300 mm.

For example, when the interval $h_3$ is decreased by additionally installing the thermal insulation plate 76B on an upper portion of the middle portion of the support member 72 in which the thermal insulation plate 76B is provided, a flat zone length of the process chamber 38 may extend. On the other hand, when the thermal insulation plate 76B is additionally provided on a lower portion of the middle portion of the support member 72, a temperature of a furnace port portion may be decreased. Whether the thermal insulation plate is additionally provided is determined by comprehensively considering a temperature recovery time, a flat zone length, thermal insulation performance and the like.

The reflective plate 76A is a disc having a diameter smaller than a diameter of the wafer W, is formed of, for example, opaque quartz, and is provided in the upper portion of the support member 72 with a predetermined interval $h_4$.

The interval $h_4$ preferably ranges from 2 mm to 10 mm. When the interval $h_4$ is smaller than 2 mm, a gas may stay in the reflective plate 76A. When the interval $h_4$ is greater than 10 mm, heat reflection performance may be reduced.

The thermal insulation plate 76B is a disc having a diameter smaller than the diameter of the wafer W, and is formed of a material having small heat capacity such as quartz, silicon (Si) and SiC. In the first embodiment, four thermal insulation plates 76B are provided below the support shelves 72A with a predetermined interval $h_5$. The interval $h_5$ is preferably 2 mm or more. When the interval $h_5$ is smaller than 2 mm, a gas may stay between the thermal insulation plates 76B.

The number of the reflective plates 76A and the number of the thermal insulation plates 76B are not limited to the above-described number of plates, and the number of the thermal insulation plates 76B is preferably greater than or equal to the number of the reflective plates 76A. Thus, as the reflective plate 76A is provided above and the thermal insulation plate 76B is provided below, radiant heat from the subheater 64 may be reflected by the reflective plate 76A and radiant heat from the heater 34 and the subheater 64 may be insulated by the thermal insulation plate 76B at a place away from the wafer W. With such a configuration, the temperature responsiveness of the wafer W may be improved, and thus a heating-up time may be reduced.

An interval $h_6$ between the inner wall of the reaction tube 36 and an outer wall of the cylinder 74 is preferably set to be small in order to suppress the process gas from being flowed out of the process chamber 38 and to be penetrated into the cylinder 74. The interval $h_6$ preferably ranges, for example, from 7.5 mm to 15 mm. In a case in which the interval $h_6$ is smaller than 7.5 mm, when the boat is rotated, the reaction tube 36 may be damaged by coming in contact with the cylinder 74. When the interval $h_6$ is greater than 15 mm, the process gas is likely to flow into a lower portion of the boat, and thus it may be adversely affected to form a film.

The boat 40 is provided on an upper surface of the cylinder 74. A groove is provided in an outer circumference of the upper surface of the cylinder 74 over a whole circumference. A ring-shaped bottom plate of the boat 40 is placed into the groove. With such a configuration, it is possible to rotate the cylinder 74 and the boat 40 without rotation of the subheater 64.

A depth of the groove of the upper surface of the cylinder 74 is substantially the same as a thickness of the bottom plate of the boat 40. When the boat 40 is placed, an upper surface of the bottom plate of the boat 40 and the upper surface of the cylinder 74 are flat. With such a configuration, it is possible to improve the flow of the process gas, and thus the uniformity of the film formed on the wafer W in a bottom region may be improved.

The upper end of the cylinder 74 has a convex shape. An inner surface of the upper end of the cylinder 74 includes a horizontal plane S1 protruding inward from an inner wall surface thereof, an inclined plane S2 which continues with the horizontal plane S1, a vertical plane S3 which continues with the inclined plane S2 in a vertical direction and a horizontal plane S4 which continues with the vertical plane S3. That is, the inclined plane S2 which connects the convex-shaped horizontal plane S1 to the vertical plane S3 has a taper shape, and a cross-sectional area of the inside of the cylinder 74 is gradually reduced toward the upper portion of the cylinder in a top view. A connection portion of the vertical plane S3 and the horizontal plane S4 is a curved surface. With such a configuration, it is possible to improve the flow of the gas into the cylinder 74, and thus the gas may be suppressed from staying in the convex-shaped portion. The purge gas supplied through the supply port 72B flows in a circumferential direction by hitting an inner wall of the upper surface of the cylinder 74, and then flows downward along a sidewall of the inside of the cylinder 74. Therefore, the purge gas may easily flow downward inside the cylinder 74. That is, the purge gas may flow downward in the second flow path. Since a lower portion of the placement portion of the boat can be formed to have a thickness greater than a thickness of a circumferential portion of the cylinder 74 by the horizontal plane S1, the strength of the cylinder 74 may be increased.

The heating unit 64B is provided in a region between an upper end of the pillar 64A and the inner wall of the upper surface of the cylinder 74. Preferably, at least a portion of the heating unit 64B is provided to be located between lowermost and uppermost ends of the inclined plane S2. That is, the heating unit 64B is provided to be accommodated in a region between a contact point of the horizontal plane S1 and the inclined plane S2 and a contact point of the inclined plane S2 and the vertical plane S3 in a vertical direction.

As described above, although the thermal insulating unit 68 is illustrated to include the cylinder 74 for convenience of description, thermal insulation is mainly performed in a region below the subheater 64, that is, in the thermal insulating member 76. Therefore, the thermal insulating unit 68 may be referred to as only the thermal insulating member 76. When the thermal insulating unit 68 is referred to as only the thermal insulating member 76, the subheater 64 is provided between the boat 40 and the thermal insulating unit 68.

Figure 4:
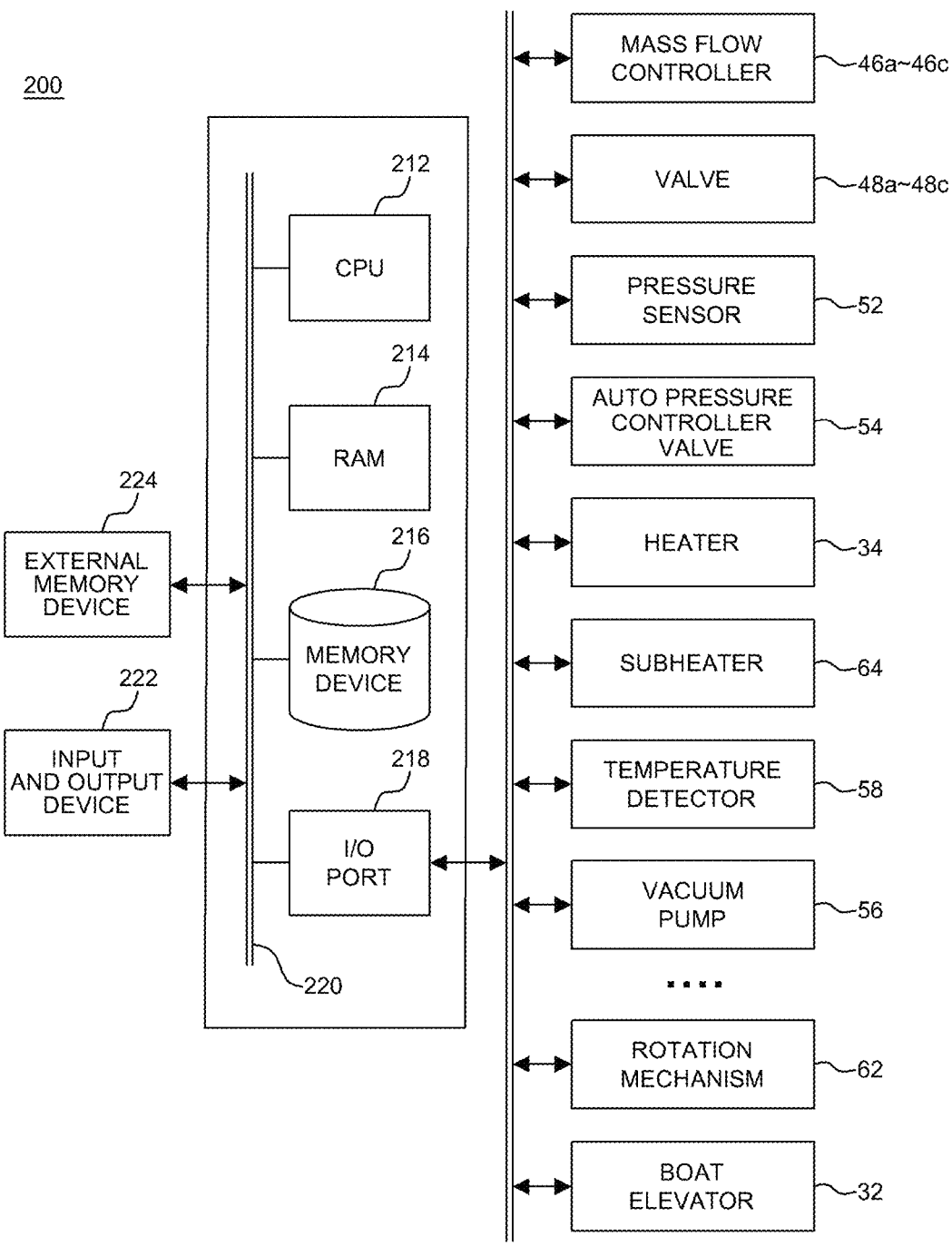
FIG. 4 is a block diagram illustrating a control system of a controller of the substrate processing apparatus preferably used in the first embodiment described herein.

As illustrated in FIG. 4, components such as the MFCs 46a through 46c, the valves 48a through 48c, the pressure sensor 52, the APC valve 54, the vacuum pump 56, the heater 34, the subheater 64, the temperature detector 58, the rotation mechanism 62 and the boat elevator 32 are connected to a controller 200 serving as a control unit (control device). The controller 200 is embodied by a computer including a central processing unit (CPU) 212, a random access memory (RAM) 214, a memory device 216 and an input-and-output (I/O) port 218. The RAM 214, the memory device 216 and the I/O port 218 may exchange data with the CPU 212 through an internal bus 220. The I/O port 218 is connected to each of the above-described components. An I/O device 222 such as a touch panel may be connected to the controller 200.

The memory device 216 is embodied by, for example, a flash memory or a hard disk drive (HDD). According to a control program controlling operations of the substrate processing apparatus 4 or process conditions, a program (a recipe such as a process recipe or a cleaning recipe) for performing processing on each of the components of the substrate processing apparatus 4 is readably stored in the memory device 216. The process recipe, the control program and the like are collectively and simply called a "program." The RAM 214 functions as a memory region (work area) in which a program, data or the like read by the CPU 212 are temporarily stored.

The CPU 212 is configured to read and execute the control program from the memory device 216, read the recipe from the memory device 216 according to an input of a manipulating command from the I/O device 222 and control each of the components according to the recipe.

The controller 200 may be embodied by installing the above-described program stored in an external memory device 224 [e.g., a magnetic tape, a magnetic disk such as a flexible disk and a hard disk, an optical disc such as a compact disc (CD) and a digital video disc (DVD), a magneto-optical disc such as an MO and a semiconductor memory such as a Universal Serial Bus (USB) memory and a memory card] in a computer. The memory device 216 or the external memory device 224 is a non-transitory computer-readable recording medium. Hereinafter, the memory device 216 and the external memory device 224 are also collectively and simply called a recording medium. When the program is provided in the computer, a communication line such as the Internet or a dedicated line may be used without using the external memory device 224.

Figure 17:
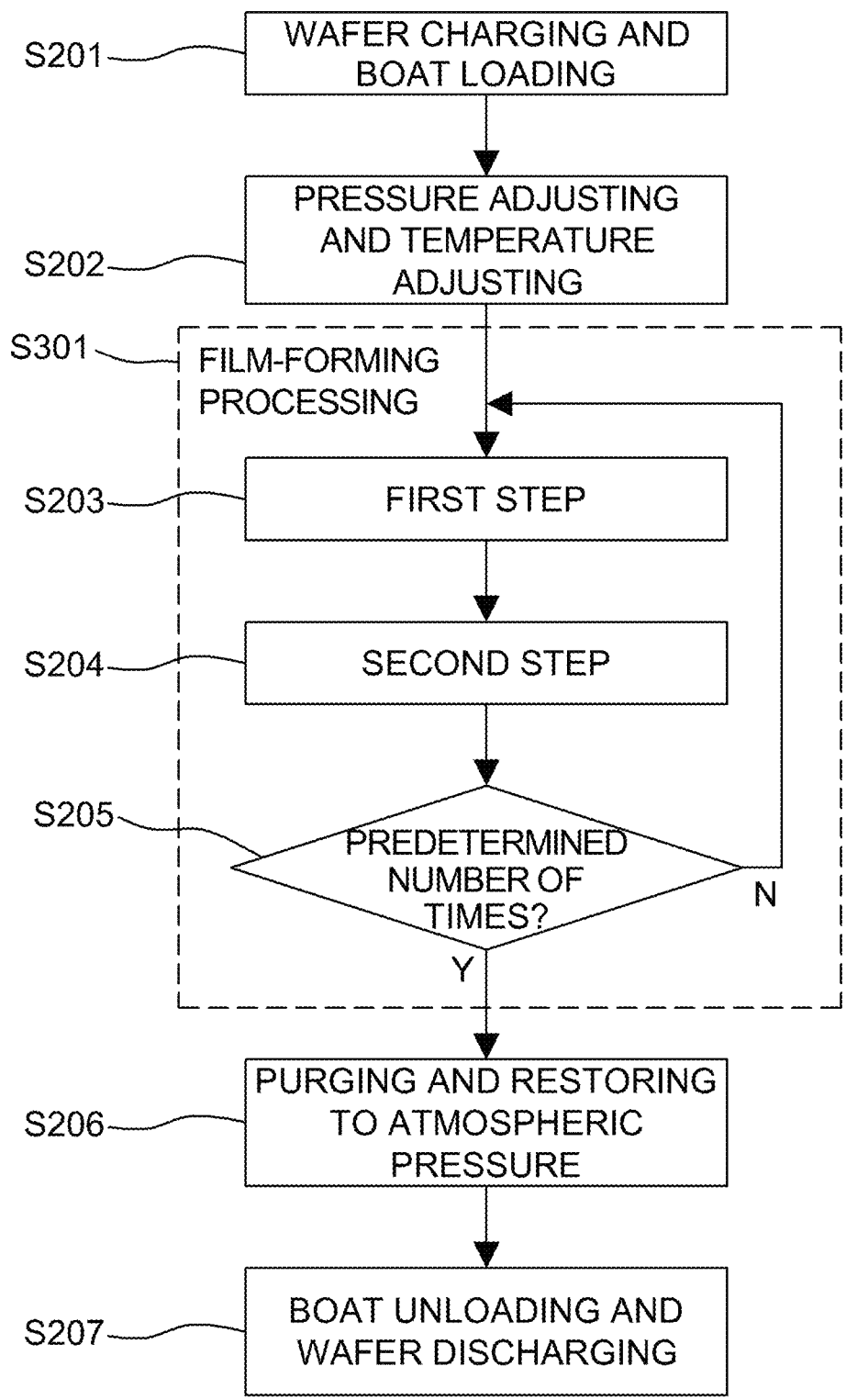
FIG. 17 is an exemplary flowchart illustrating a method of manufacturing a semiconductor device described herein.

Next, as an example of a method of manufacturing a semiconductor device using the above-described substrate processing apparatus 4, an example of a sequence of processing of forming a film on a substrate (hereinafter referred to as film-forming processing) will be described with reference to FIG. 17.

Hereinafter, an example in which a silicon nitride (SiN) film is formed on the wafer W using hexachlorodisilane (HCDS) gas serving as a first process gas (source gas) and ammonia ($NH_3$) gas serving as a second process gas (reaction gas) will be described. In the following description, the controller 200 controls operations of respective components of the substrate processing apparatus 4.

In the film-forming processing in the first embodiment, a step of supplying HCDS gas onto the wafer W in the process chamber 38, a step of removing the HCDS gas (residual gas) from the process chamber 38, a step of supplying $NH_3$ gas onto the wafer W in the process chamber 38 and a step of removing the $NH_3$ gas (residual gas) from the process chamber 38 are repeated a predetermined number of times (once or more), and thus a SiN film is formed on the wafer W.

In this specification, the above-described film-forming sequence in the first embodiment may be represented as follows. Film-forming sequences in following modifications or other embodiments are also the same as the film-forming sequence in the first embodiment.

(HCDS→$NH_3$)×n=>SiN

Wafer Charging and Boat Loading (S201)

The plurality of wafers W are charged on the boat 40 (wafer charging) and the boat 40 is loaded into the process chamber 38 by the boat elevator 32 (boat loading). In this case, the seal cap 60 air-tightly seals the lower end of the manifold 35 through the O rings 60A. In a standby state before performing the wafer charging, a purge gas is supplied into the cylinder 74 by opening the valve 48c.

Pressure Adjusting and Temperature Adjusting (S202)

The inside of the process chamber 38, that is, a space in which the wafer W is present, is vacuum-exhausted (depressurized and exhausted) by the vacuum pump 56 until a predetermined pressure (a degree of vacuum) is reached. In this case, the inner pressure of the process chamber 38 is measured by the pressure sensor 52 and the APC valve 54 is fed back and controlled based on measured pressure information. Until at least the processing for the wafer W is completed, the vacuum pump 56 continuously operates. Until at least the processing for the wafer W is completed, the purge gas is continuously supplied into the cylinder 74.

The inside of the process chamber 38 is heated by the heater 34 and the subheater 64 so that the wafer W inside the process chamber 38 has a predetermined temperature. In this case, a state of power supply to the heater 34 and the subheater 64 is fed back and controlled based on temperature information detected by the temperature detector 58 so that the inside of the process chamber 38 has a predetermined temperature distribution. Until at least the processing for the wafer W is completed, the heater 34 and the subheater 64 continuously heat the inside of the process chamber 38. It may be stopped that the inside of the process chamber 38 is heated by the subheater 64 as necessary.

The boat 40 and the wafer W are rotated by the rotation mechanism 62. As the rotation mechanism 62 rotates the boat 40 through the rotary shaft 66, the base member 70 and the cylinder 74, the wafer W is rotated without rotating the subheater 64. Until at least the processing for the wafer W is completed, the rotation mechanism 62 continuously rotates the boat 40 and the wafer W.

Film-Forming Processing (S301)

When the internal temperature of the process chamber 38 is stabilized to a preset processing temperature, first step S203 and second step S204 are sequentially performed.

First Step (S203)

In first step S203, HCDS gas is supplied onto the wafer W inside the process chamber 38.

HCDS gas and $N_2$ gas are respectively supplied into the gas supply pipe 44a and the gas supply pipe 44b by opening the valve 48a and the valve 48b. Flow rates of the HCDS gas and the $N_2$ gas are respectively adjusted by the MFCs 46a and 46b, and the HCDA gas with the flow rate thereof adjusted and the $N_2$ gas with the flow rate thereof adjusted are supplied into the process chamber 38 through the nozzle 42 and are exhausted through the exhaust pipe 50. A silicon-containing layer serving as a first layer having a thickness of, for example, less than one atomic layer to several atomic layers is formed on a top surface of the wafer W by supplying the HCDS gas onto the wafer W.

After the first layer is formed, the supply of the HCDS gas is stopped by closing the valve 48a. In this case, an unreacted gas remaining in the process chamber 38 or HCDS gas that has contributed to formation of the first layer is exhausted from the process chamber 38 by vacuum-exhausting the inside of the process chamber 38 using the vacuum pump 56 with the APC valve 54 open. In this case, while the valve 48b is opened, the $N_2$ gas is continuously supplied into the process chamber 38. The $N_2$ gas serves as a purge gas, and thus it is possible to increase an effect of exhausting the residual gas in the process chamber 38 from the process chamber 38 by the $N_2$ gas.

Second Step (S204)

In second step S204, $NH_3$ gas is supplied onto the wafer W inside the process chamber 38.

In second step S204, the valves 48a and 48b are controlled in the same manner as in first step. Flow rates of the $NH_3$ gas and the $N_2$ gas are respectively adjusted by the MFCs 46a and 46b, the $NH_3$ gas with the flow rate thereof adjusted and the $N_2$ gas with the flow rate thereof adjusted are supplied into the process chamber 38 through the nozzle 42 and are exhausted through the exhaust pipe 50. The $NH_3$ gas supplied onto the wafer W reacts with the first layer formed on the wafer W in first step, that is, at least a portion of the silicon-containing layer. Thus, the first layer is nitrided and is changed (modified) to a second layer including S1 and N, that is, a silicon nitride layer (SiN layer).

After the second layer is formed, the supply of the $NH_3$ gas is stopped by closing the valve 48a. In the same processing sequence as first step, an unreacted gas remaining in the process chamber 38, $NH_3$ gas that has contributed to formation of the second layer or reaction by-products is exhausted from the process chamber 38.

Performing a Predetermined Number of Times (S205)

An SiN film having a predetermined composition and a predetermined film thickness is formed on the wafer W by performing a cycle including two steps S203 and S204 performed non-simultaneously a predetermined number of times (n times). The above-described cycle is preferably repeated multiple times.

Processing conditions of the sequence include, for example, a processing temperature (wafer temperature) ranging from 250° C. to 700° C., a processing pressure (inner pressure of the process chamber) ranging from 1 Pa to 4,000 Pa, a flow rate of HCDS gas ranging from 1 sccm to 2,000 sccm, a flow rate of $NH_3$ gas ranging from 100 sccm to 10,000 sccm and a flow rate of $N_2$ gas ranging from 100 sccm to 10,000 sccm. The film-forming processing may appropriately proceed by setting the respective process conditions to the values within respective ranges.

Purging and Restoring to Atmospheric Pressure (S206)

After the film-forming processing is completed, by opening the valve 48b, the $N_2$ gas is supplied into the process chamber 38 through the gas supply pipe 44b and is exhausted through the exhaust pipe 50. The $N_2$ gas serves as a purge gas. Thus, the inside of the process chamber 38 is purged, and the residual gas inside the process chamber 38 or the reaction by-products is removed from the process chamber 38 (purging). Then, an inner atmosphere of the process chamber 38 is replaced with an inert gas (inert gas replacement) and the inner pressure of the process chamber 38 is restored to a normal pressure (restoring to atmospheric pressure).

Boat Unloading and Wafer Discharging (S207)

The lower end of the manifold 35 is opened by lowering the seal cap 60 by the boat elevator 32. The processed wafer W is unloaded to the outside of the reaction tube 36 through the lower end of the manifold 35 while being supported on the boat 40 (boat unloading). The processed wafer W is discharged from the boat 40 (wafer discharging).

Next, a configuration of the embodiment described herein and a conventional configuration will be compared and described.

In the conventional configuration, as the subheater 64 is exposed to the process gas, the thin film may be formed on a surface of the subheater 64 to exert a negative influence on heating performance. When the thermal insulating member 76 is exposed to the process gas, the thin film may be formed on a surface of the thermal insulating member 76. As the thin film formed on the surface of the subheater 64 or thermal insulating member 76 is detached, particles may be generated inside the process chamber 38.

As results of intensive studies, the inventors have found that the subheater 64 or the thermal insulating member 76 may be suppressed from being exposed to the process gas by isolating the subheater 64 or the thermal insulating member 76 from the atmosphere of the process chamber 38 and purging the isolated space. That is, the inventors have found that the thin film may be suppressed from being formed on the surface of the subheater 64 or thermal insulating member 76 by installing the subheater 64 or the thermal insulating member 76 inside the cylinder 74 and purging the inside of the cylinder 74.

Figure 5:
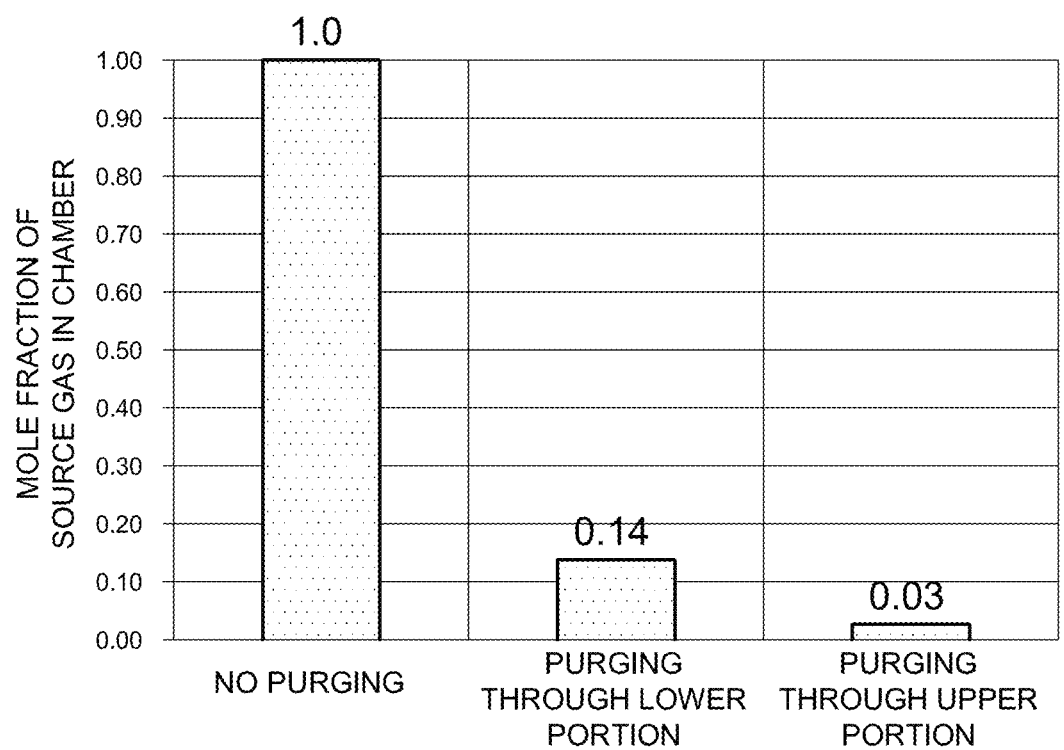
FIG. 5 is a view illustrating a mole fraction of a process gas inside a cylinder when a position at which a purge gas is supplied is changed.

The supply of the purge gas into the cylinder 74 will be described with reference to FIG. 5. A result of comparing a diffusion amount of the process gas into the cylinder 74 when the purge gas is not supplied into the cylinder 74, a diffusion amount of the process gas into the cylinder 74 when the purge gas is supplied through a lower portion of the inside of the cylinder 74 and a diffusion amount of the process gas into the cylinder 74 when the purge gas is supplied through an upper portion of the inside of the cylinder 74 is illustrated in FIG. 5. When a mole fraction of the process gas inside the process chamber 38 is 1, a mole fraction of the process gas in the vicinity of the subheater 64 when the purge gas is not supplied into the cylinder 74 is 1. On the other hand, a mole fraction of the process gas in the vicinity of the subheater 64 when the purge gas is supplied into the cylinder 74 through the lower portion thereof is about 0.14. A mole fraction of the process gas in the vicinity of the subheater 64 when the purge gas is supplied into the cylinder 74 through the upper portion thereof is about 0.03.

When the purge gas is not supplied into the cylinder 74, the process gas is introduced into the cylinder 74 through the exhaust holes 70A and the inside of the cylinder 74 becomes the same atmosphere as that of the process chamber 38. On the other hand, when the purge gas is supplied into the cylinder 74, the process gas may be suppressed from being introduced into the cylinder 74 through the exhaust holes 70A.

Figure 6:
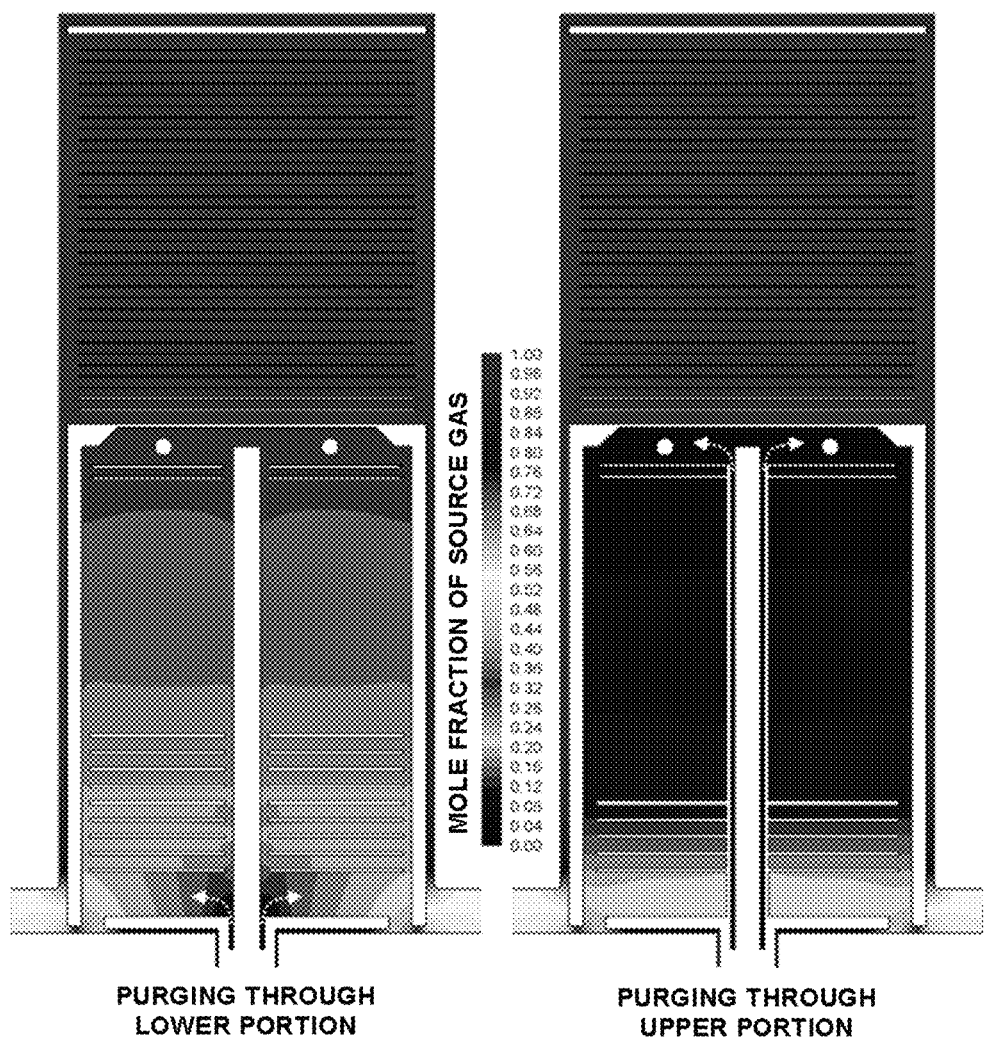
FIG. 6 is a view illustrating a mole fraction of a process gas inside a process chamber when a position at which a purge gas is supplied is changed.

As illustrated in FIG. 6, a mole fraction of the upper portion of the inside of the cylinder 74 in which the heating unit 64B is provided when the inside of the cylinder 74 is purged through the upper portion of the cylinder 74 is smaller than that when the inside of the cylinder 74 is purged through the lower portion of the cylinder 74. When the purge gas is supplied into the cylinder 74 through the lower portion of the cylinder 74, since the thermal insulating member 76 is provided above the purge gas supply port, the purge gas is inhibited from flowing into the upper portion, the purge gas is easy to stay in a lower portion of the thermal insulating member 76, and thus it is difficult to purge the upper portion of the inside of the cylinder 74. Therefore, the process gas is easily diffused to the upper portion of the inside of the cylinder 74 by concentration diffusion. Since the process gas is slightly introduced into the cylinder 74 through the exhaust holes 70A has a temperature slightly higher than the purge gas supplied into the cylinder 74, an ascending air current is generated. Therefore, the process gas is considered to flow into the upper portion of the inside of the cylinder 74. Since the subheater 64 is provided in the upper portion of the inside of the cylinder 74, a temperature of the upper portion of the inside of the cylinder 74 is higher than a temperature of the vicinity of the thermal insulating member 76. Therefore, it is considered that the purge gas having a temperature lower than a temperature in an atmosphere of the upper portion of the inside of the cylinder 74 mainly flows through the exhaust holes 70A rather than flows into the upper portion.

On the other hand, when the purge gas is supplied into the cylinder 74 through the upper portion of the inside of the cylinder 74, since the purge gas supply port is provided in the vicinity of the subheater, the purge gas may be maintained with high concentration (the process gas may be maintained with low concentration). As the purge gas is supplied into the cylinder 74 through the upper portion of the inside of the cylinder 74, the purge gas may flow from the supply port 72B in the upper portion of the inside of the cylinder 74 to the exhaust holes 70A in the lower portion thereof (down flow), and it is considered that the process gas may be further effectively suppressed from being diffused into the upper portion thereof. When the purge gas is supplied into the cylinder 74 through the upper portion of the inside of the cylinder 74, it is considered that the temperature of the purge gas supplied into the cylinder 74 is higher than the temperature of the process gas slightly introduced into the cylinder 74 through the exhaust holes 70A. Therefore, the upper portion of the inside of the cylinder 74 is easily charged to the atmosphere of the purge gas.

Figure 7:
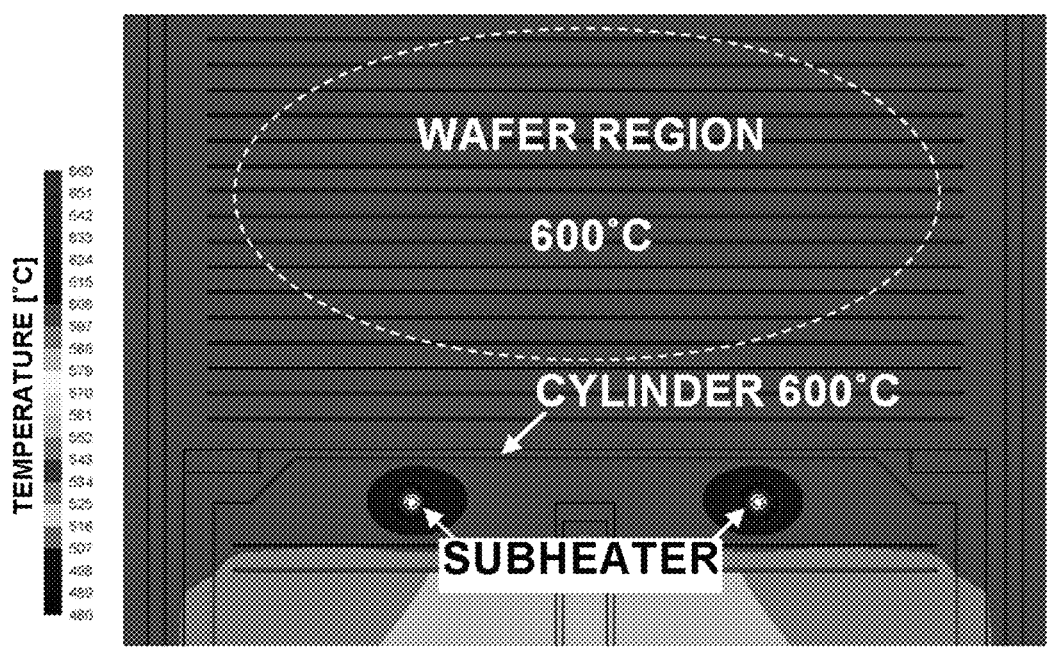
FIG. 7 is a view illustrating a temperature distribution of a bottom region when an inside of a process chamber is heated according to the first embodiment described herein.
Figure 8:
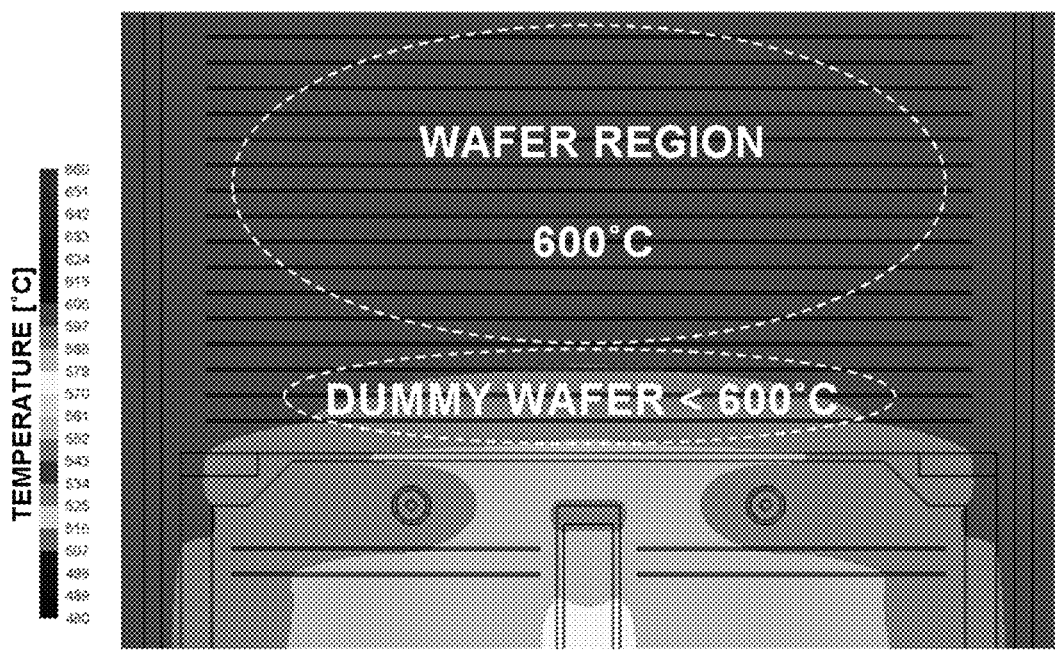
FIG. 8 is a view illustrating a temperature distribution of a bottom region when an inside of a process chamber is heated according to a conventional example.

Next, a result of analyzing the temperature in the configuration in the embodiment described herein is illustrated in FIG. 7. In an example of FIG. 7, for example, a process temperature is 600° C. and a setting temperature of the subheater 64 is 680° C. A temperature of the wafer in a lowermost portion of the boat 40 is maintained at 600° C. and the temperature of the cylinder 74 is maintained at 600° C. Therefore, it may be seen that the film-forming processing may be performed without installing a dummy wafer in a lower portion of the boat 40. There is no portion having a high temperature in which the process gas may overreact, that is, a portion having a temperature higher than the process temperature, inside the process chamber 38. Therefore, as the subheater 64 is provided inside the cylinder 74, power may be continuously applied to the subheater 64 even when the process is processed. Thus, productivity may be improved. As a conventional example, a result of analyzing a temperature when the subheater 64 is not used is illustrated in FIG. 8. Since the temperature in the lowermost portion of the boat 40 is smaller than or equal to the process temperature, it may be seen that the dummy wafer has to be provided.

Figure 9:
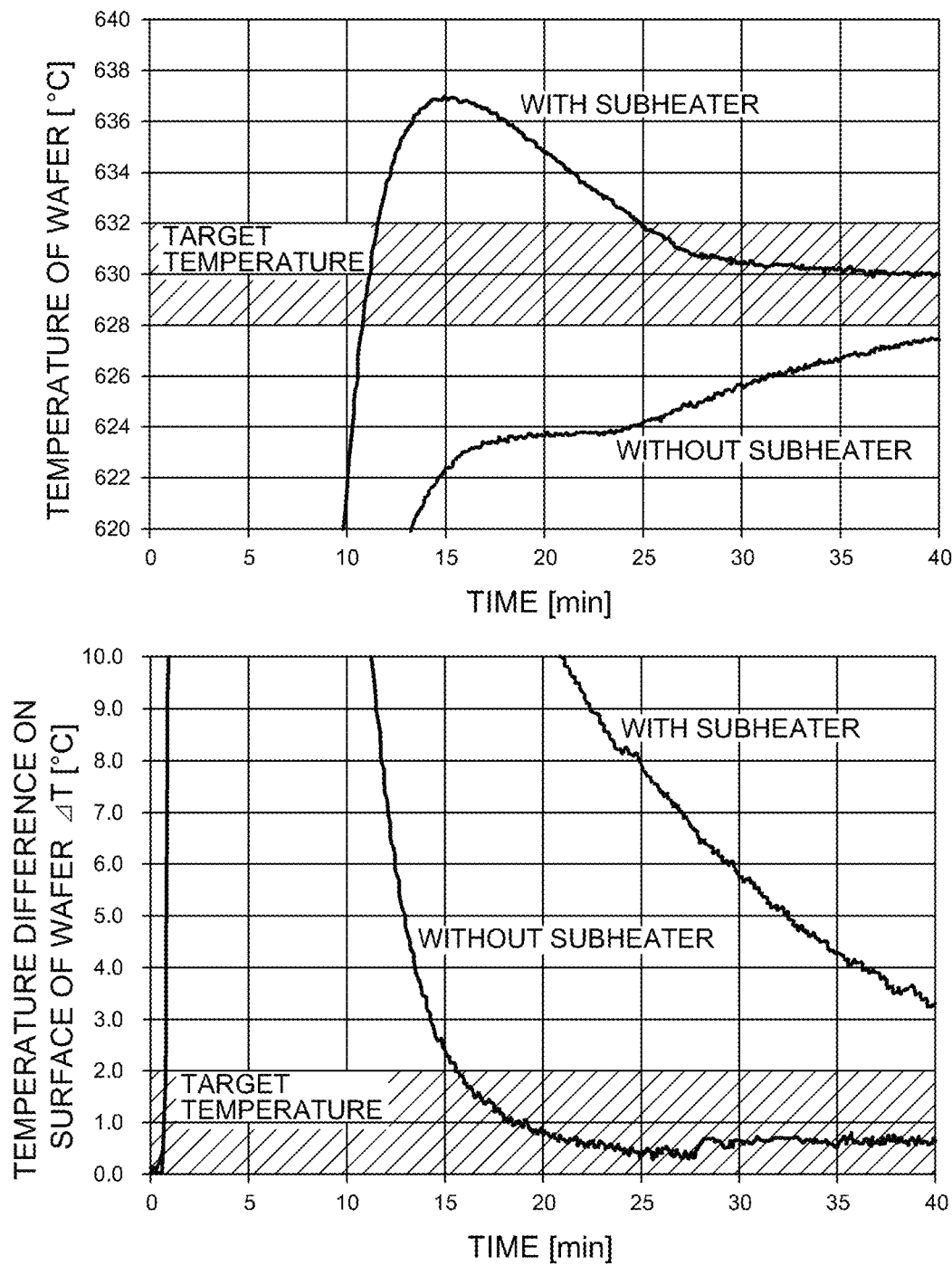
FIG. 9 is views illustrating a temperature of a wafer and a temperature difference on a surface of the wafer when the inside of the process chamber is heated according to the first embodiment described herein and the conventional example.

Data in the configuration of the embodiment described herein and data in the conventional configuration, which are actually measured when the temperature is raised, is illustrated in FIG. 9. A temperature difference ΔT on the surface of the substrate and a substrate temperature T in the configuration of the embodiment described herein converge faster with respect to target values than in the conventional configuration. In an example of FIG. 9, the target values are ΔT=2° C. and T=630±2° C. It is possible to raise the temperature with a high speed by using the subheater 64, and thus productivity may be improved. As at least the vicinity of the subheater 64 is purged with the purge gas and the process gas is suppressed from being in contact with the subheater 64, the subheater 64 may be used in any step during the process.

In the first embodiment, one or more effects of the following effects may be obtained.

(a) As the subheater 64 is provided inside the cylinder 74 and the inside of the cylinder 74 is purged, the thin film may be suppressed from being formed on the surface of the subheater 64. Thus, even when the process is processed, power is possible to be continuously applied to the subheater 64 and the temperature uniformity on the surface of the substrate in a bottom region may be secured. Therefore, the uniformity of the film formed on the surface of the substrate may be improved. Since there is no need to dispose the dummy wafer on the lower portion of the boat 40, productivity may be improved.

(b) As the purge gas is supplied into the cylinder 74 through the upper portion of the inside of the cylinder 74 [the vicinity of the subheater 64], the vicinity of the subheater 64 may become a purge gas atmosphere, and the process gas may be prevented from coming in contact with the subheater 64. Thus, the thin film may be prevented from being formed on the surface of the subheater 64, and particles may be suppressed from being generated or the heating performance of the subheater 64 may be suppressed from being reduced.

(c) As the subheater 64 is provided below the boat 40, a time required for heating the wafer in the bottom portion of the boat 40 may be reduced, and thus a recovery time may be reduced.

Figure 10:
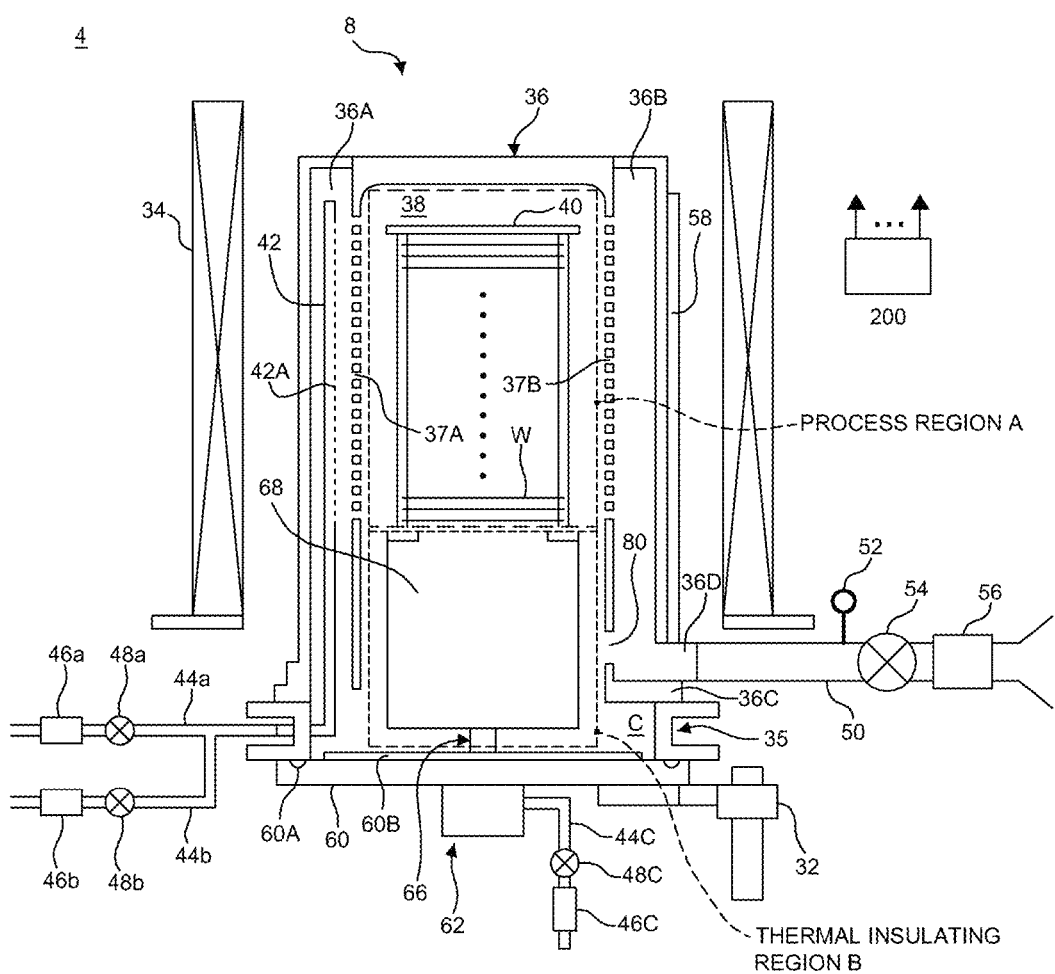
FIG. 10 is a vertical cross-sectional view schematically illustrating a processing furnace of a substrate processing apparatus preferably used in a second embodiment described herein.

Next, a second embodiment will be described. Differences from the first embodiment are that a second exhaust unit is provided and an exhaust path which exhausts the purge gas from the inside of the cylinder 74 is disposed independently of the exhaust path in the film-forming region. In FIG. 10, the same reference numerals are given to substantially the same components as those described in FIG. 1, and description thereof will be omitted.

As illustrated in FIG. 10, An exhaust port 80 serving as a second exhaust unit (second exhaust port) is provided at an inner wall of a lower portion of the reaction tube 36 [a region in which the thermal insulating unit 68 is provided, that is, a thermal insulating region B]. A flow path from the exhaust holes 70A to the exhaust port 80 functions as a purge exhaust path for exhausting a purge gas by providing the exhaust port 80. The exhaust port 80 communicates with the process chamber 38 and the gas exhaust space 36B, and an atmosphere in the thermal insulating region B inside the process chamber 38 is exhausted through the exhaust port 80. That is, as the exhaust port 80 is provided to correspond to the thermal insulating region B, the purge gas in the thermal insulating region B is suppressed from being diffused into a process region A, the process gas in the process region A is diluted, and thus the uniformity of the film is suppressed from being degraded.

Preferably, the exhaust port 80 is provided at a position corresponding to the thermal insulating unit 68. In other words, the exhaust port 80 is provided at a position corresponding to the thermal insulating region B. Preferably, at least a portion of the exhaust port 80 overlaps the exhaust port 36D [a connection portion of the exhaust pipe 50 and the reaction tube 36]. With such a configuration, the purge gas may be more efficiently exhausted. That is, the process gas and the purge gas may be easily exhausted without stagnation or stay of the process gas or the purge gas in the gas exhaust space 36B.

The purge gas which purges the inside of the thermal insulating unit 68 is exhausted through the exhaust holes 70A. The purge gas is supplied into the process chamber 38 through a portion [lower portion of the thermal insulating region B] lower than the lower end [flange 36C] of the reaction tube 36. An annular space C is formed below the flange 36C. The thermal insulating region B may include the space C. In a top view, a width of the annular space C is greater than the distance [h6 in FIG. 2] between the inner wall of the reaction tube 36 and the outer wall of the thermal insulating unit 68. With such a configuration, the purge gas may flow along an edge of the space C. Thus, the vicinity of the exhaust holes 70A may always become a purge gas atmosphere and the film-forming gas may be suppressed from being introduced into the thermal insulating unit 68. The purge gas exhausted through the exhaust holes 70A opposite to the exhaust port 80 may also be easily exhausted through the space C.

Figure 11:
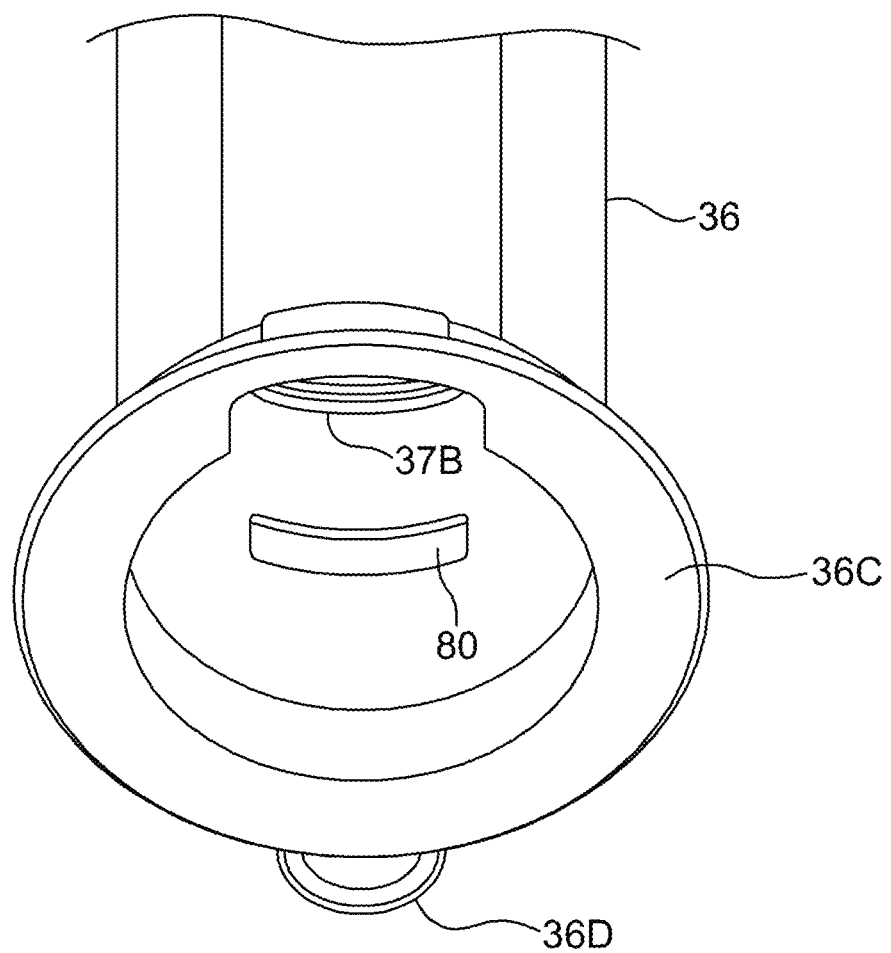
FIG. 11 is a perspective view illustrating an exhaust port of the substrate processing apparatus preferably used in the second embodiment described herein.

As illustrated in FIG. 11, the exhaust port 80 is a rectangle, and an opening area thereof is greater than an opening area of a single gas exhaust slit 37B and smaller than a total opening area of the gas exhaust slits 37B. A length of a long edge of the rectangular exhaust port 80 is smaller than or equal to a width of the gas exhaust space 36B. With such a configuration, specifically, the purge gas may be suppressed from being exhausted in a boundary portion of the process region A and the thermal insulating region B through the gas exhaust slit 37B.

Corners of the exhaust port 80 are chamfered and have a rounded shape. With such a configuration, the stress may be suppressed from being concentrated and damaged on the corners. The corners of the exhaust port 80 are provided so that the purge gas easily flows and is further efficiently exhausted.

Figure 12:
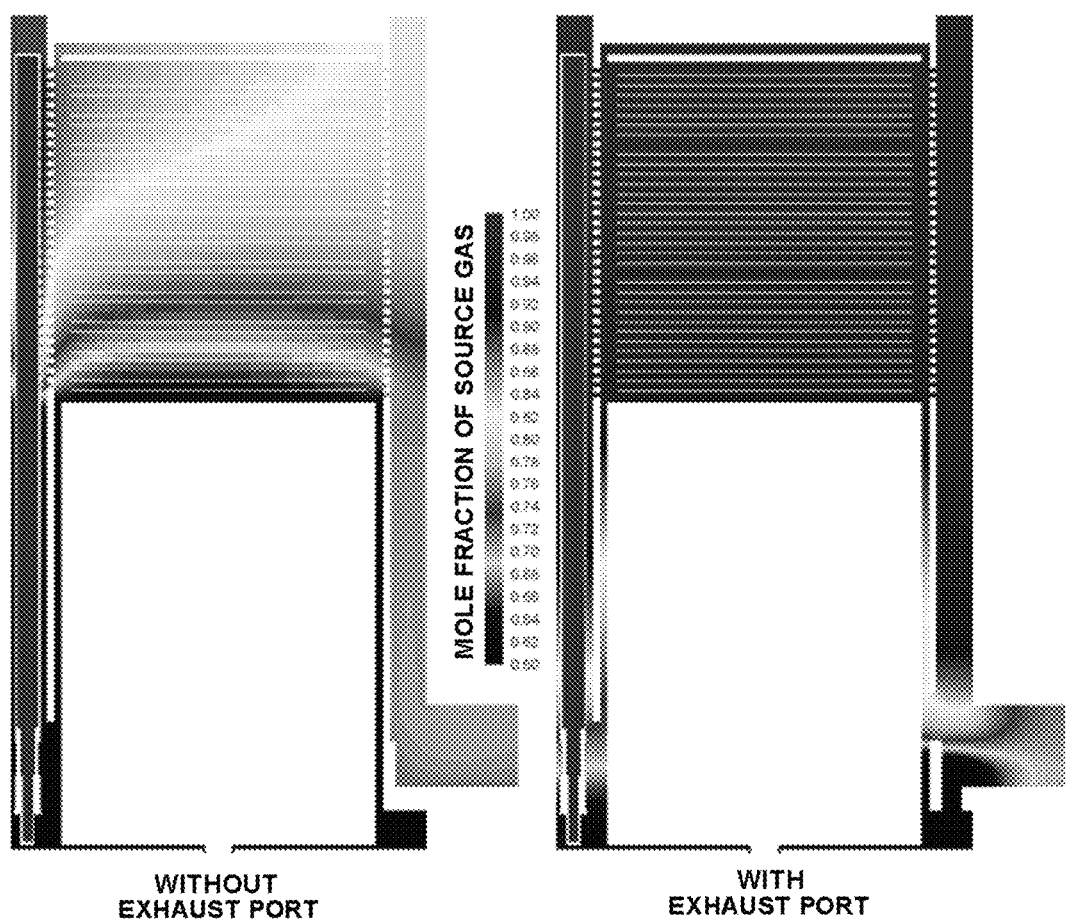
FIG. 12 is a view illustrating a mole fraction of a process gas in the second embodiment described herein and a comparative example.

A result of comparing mole fractions according to the presence or absence of the exhaust port 80 is illustrated in FIG. 12. When there is no exhaust port 80, the purge gas which purges the inside of the cylinder 74 is diffused into the film-forming region, the process gas is diluted, and specifically, a mole fraction of the process gas in the bottom region may be reduced. On the other hand, when there is the exhaust port 80, since the purge gas exhausted through the exhaust holes 70A is exhausted through the exhaust port 80, the purge gas is not diffused into the film-forming region and the film-forming region has approximately the same mole fraction in the entire region. The purge gas exhausted from the cylinder may be suppressed from being diffused into the process region A by installing the exhaust port 80, and the uniformity of the film may be suppressed from being degraded by diluting the process gas in the process region A.

Next, a third embodiment will be described. In the third embodiment, a third exhaust port 82 is provided in the flange 36C of the reaction tube 36.

Figure 13:
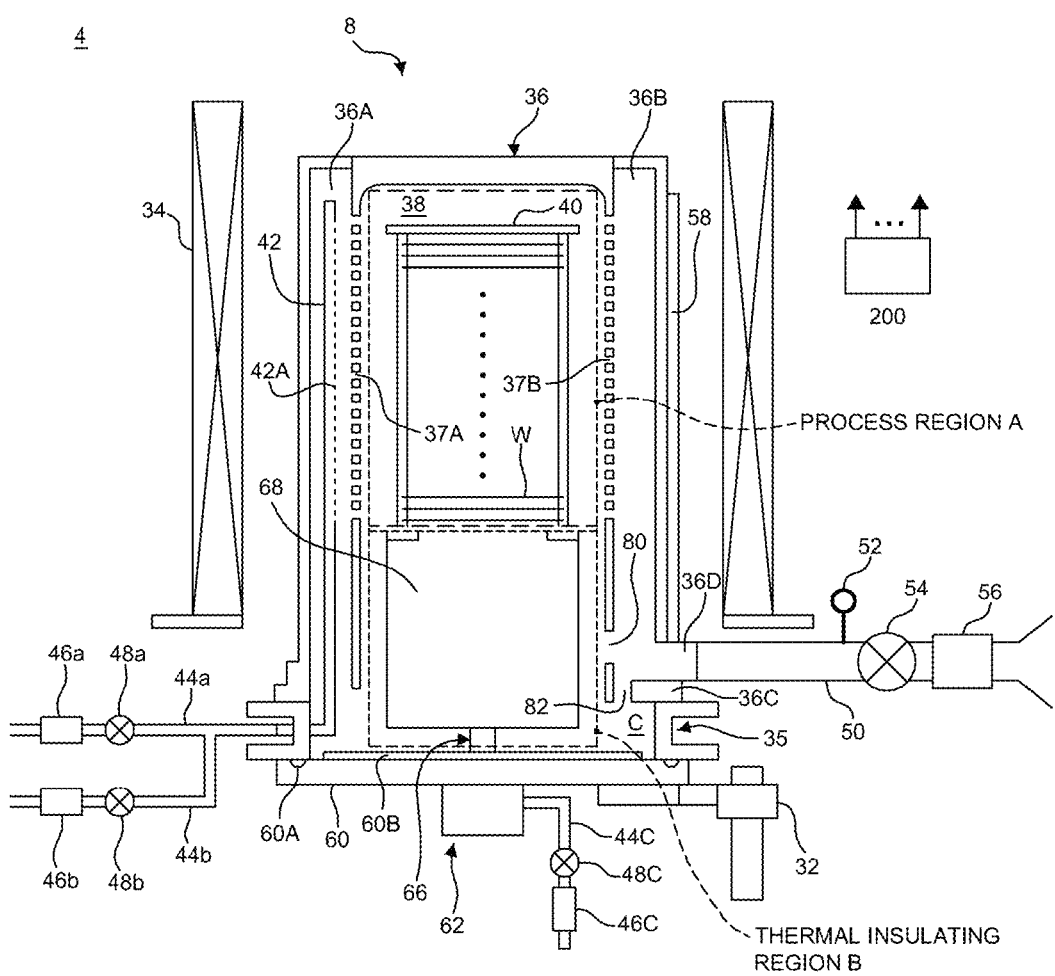
FIG. 13 is a vertical cross-sectional view schematically illustrating a processing furnace of a substrate processing apparatus preferably used in a third embodiment described herein.
Figure 14:
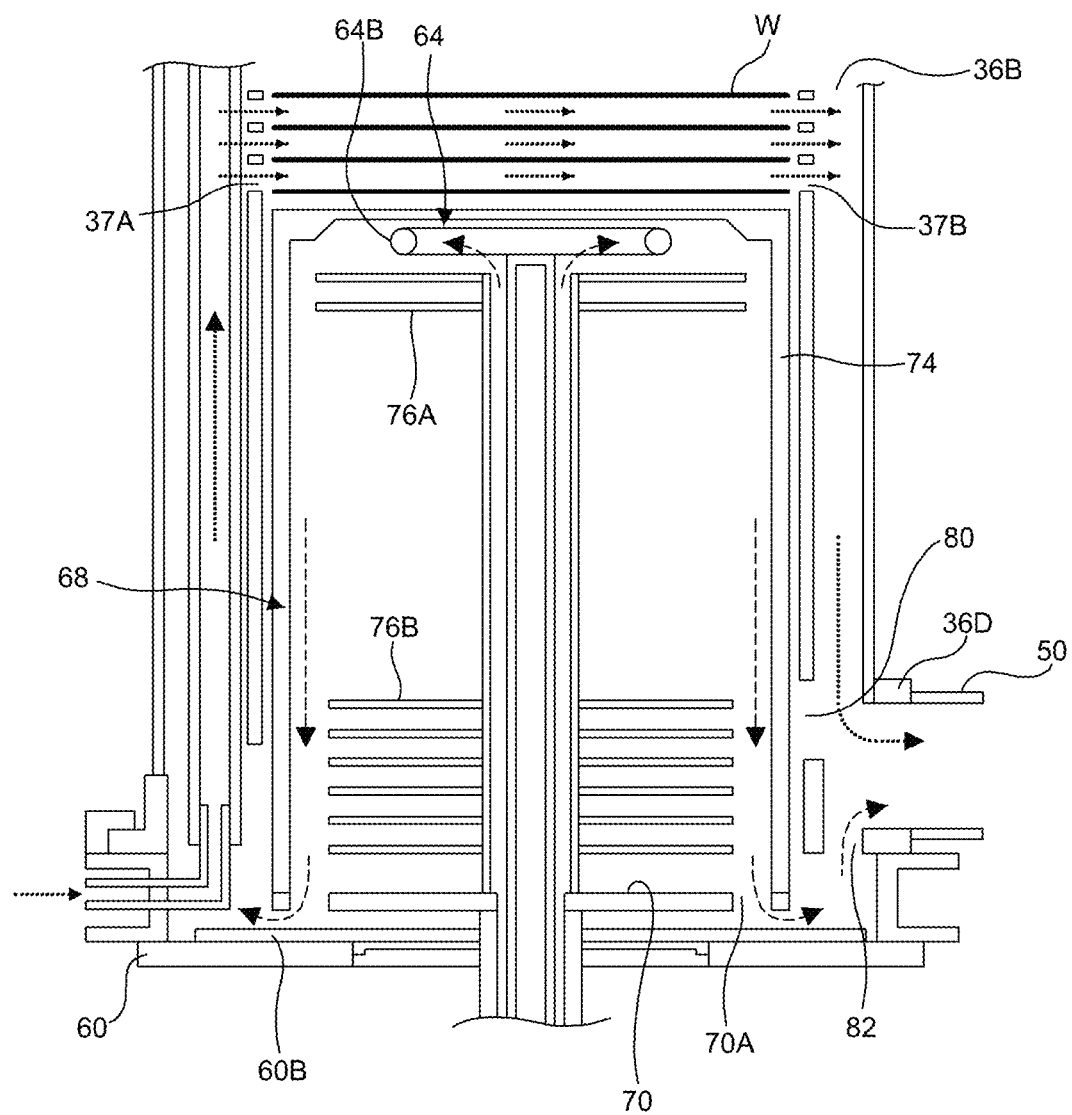
FIG. 14 is a vertical cross-sectional view schematically illustrating a thermal insulating unit of the substrate processing apparatus preferably used in the third embodiment described herein.

As illustrated in FIGS. 13 and 14, the exhaust port 82 serving as a third exhaust unit (third exhaust port) is provided in the flange 36C below the exhaust port 80. The exhaust port 82 is formed so that the space C communicates with the gas exhaust space 36B. The purge gas supplied through the gas supply pipe 44c is exhausted through the exhaust port 80 and the exhaust port 82, and the atmosphere in the thermal insulating region B is exhausted by the exhaust port 80 and the exhaust port 82. That is, the purge gas supplied into the vicinity of the thermal insulating unit 68 may be suppressed from being diffused into the process region A, and the uniformity of the film may be suppressed from being degraded by diluting the process gas in the process region A. Since the thermal insulating region B, specifically, the space C in the vicinity of the furnace port portion [the vicinity of the manifold 35] is directly exhausted, the purge gas may be suppressed from staying or stagnating in the space C.

An opening area of the exhaust port 82 is preferably smaller than an opening area of the exhaust port 80. Preferably, a width of the exhaust port 82 is smaller than a width of the exhaust port 80. With such a configuration, an exhaust amount of the exhaust port 80 may be greater than an exhaust amount of the exhaust port 82. Thus, a large amount of purge gas may be prevented from being exhausted through the exhaust port 82 before the purge gas reaches the thermal insulating unit 68 and the vicinity of the thermal insulating unit 68, and the thermal insulating unit 68 may be appropriately purged.

Next, a fourth embodiment will be described. In the fourth embodiment, a thermal insulating unit 68 which is vertically divided is used.

Figure 15:
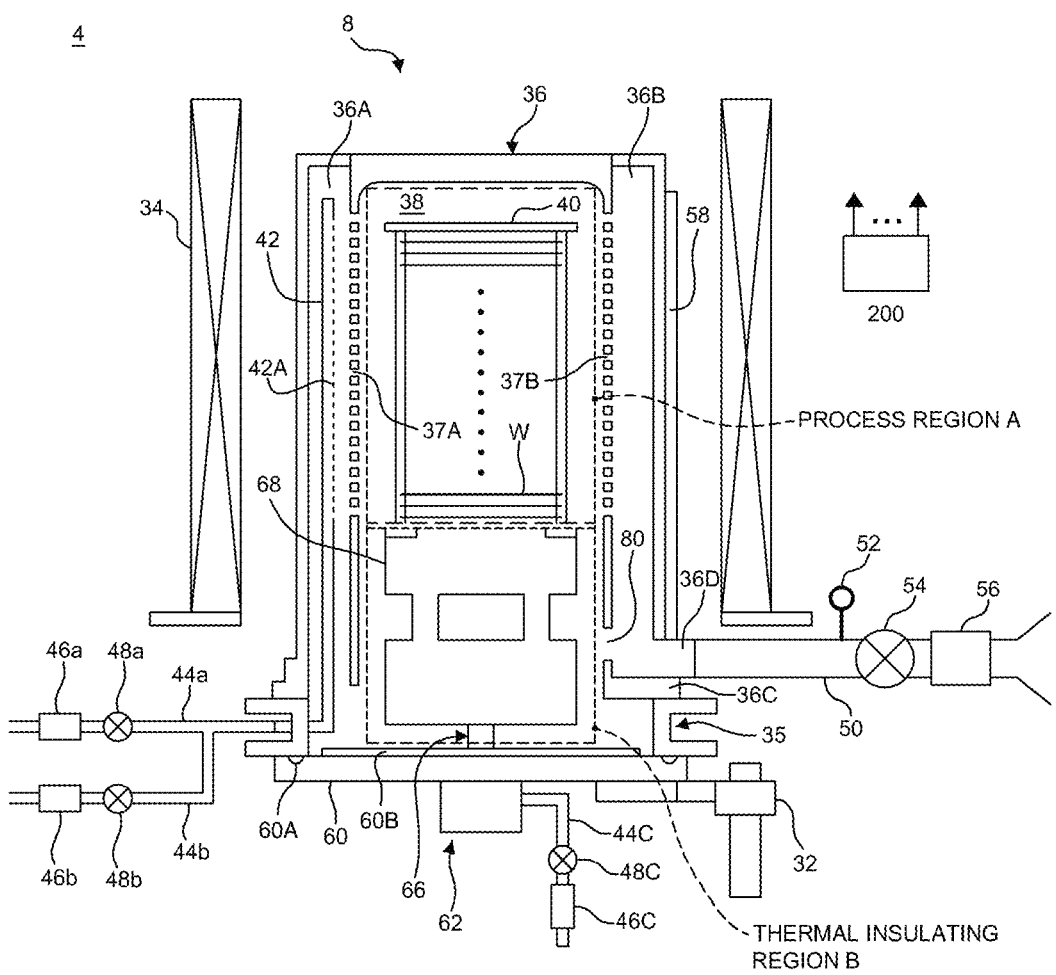
FIG. 15 is a vertical cross-sectional view schematically illustrating a processing furnace of a substrate processing apparatus preferably used in a fourth embodiment described herein.
Figure 16:
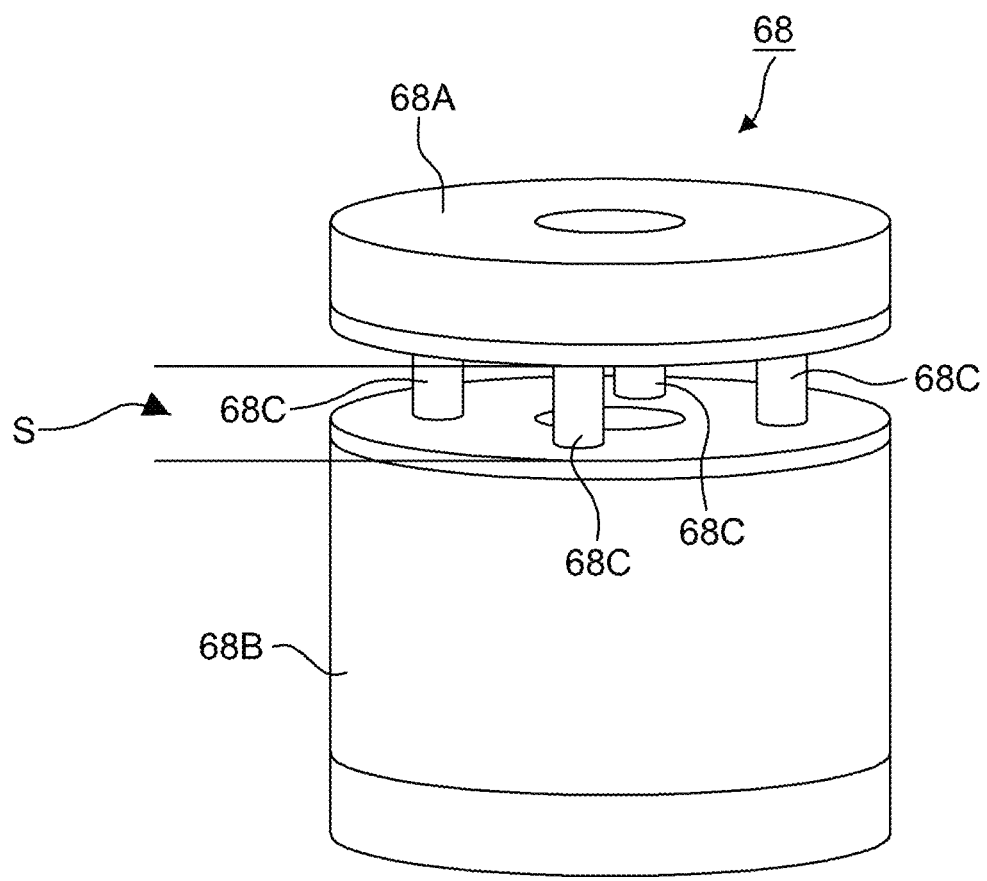
FIG. 16 is a perspective view illustrating a thermal insulating unit of the substrate processing apparatus preferably used in the fourth embodiment described herein.

As illustrated in FIGS. 15 and 16, the thermal insulating unit 68 includes a cylindrical upper thermal insulating member 68A and a cylindrical lower thermal insulating member 68B. For example, four cylindrical-shaped support members 68C are provided in the vicinity of an upper surface of the lower thermal insulating member 68B with an equal interval. The upper thermal insulating member 68A is supported by the support members 68C spaced a predetermined gap S from the lower thermal insulating member 68B.

The exhaust port 80 is provided within the gap S between the upper thermal insulating member 68A and the lower thermal insulating member 68B, that is, at a position at which at least a portion thereof overlaps the gap S. With such a configuration, the purge gas in the vicinity of the thermal insulating unit 68 is exhausted through the exhaust port 80 via the gap S.

Since the exhaust port 80 does not exist in the vicinity thereof, the purge gas which flows in a gap in the vicinity of the gas supply space 36A of the gap between the outer wall of the thermal insulating unit 68 and the inner wall of the reaction tube 36 is difficult to be exhausted, and may be diffused into the process region A. On the other hand, since the purge gas flows toward the gap S by providing the gap S, the purge gas may be further efficiently exhausted without reaching the process region A. Preferably, at least a portion of the exhaust port 80 overlaps at least a portion of the gap S. With such a configuration, since the purge gas passing though the gap S may be linearly exhausted through the exhaust port 80, a flow of exhaustion without stagnation may be formed. As the purge gas in the gap S horizontally flows (as a gas curtain is formed), the atmosphere in the process region A may be maintained independently of the atmosphere in the exhaust hole 70A. Thus, the uniformity of the film may be suppressed from being degraded by diluting the process gas in the process region A.

The fourth embodiment using the cylindrical upper thermal insulating member 68A and the cylindrical lower thermal insulating member 68B has been described. However, the fourth embodiment is not limited thereto. The fourth embodiment may be applied to a configuration in which the thermal insulating unit 68 has a plurality of thermal insulating plates which are stacked and at least a portion of the gap S which overlaps the exhaust port 80 is disposed between the plurality of thermal insulating plates which are stacked. The fourth embodiment may also be applied to a configuration in which the exhaust port 82 in the above-described third embodiment is additionally provided as well as the exhaust port 80.

The above-described embodiments may be preferably applied to a configuration in which a film including a predetermined element such as a semiconductor element or a metal element is formed.

In the above-described embodiments, examples in which the film is deposited on the wafer W have been described. However, the described technique is not limited thereto. Preferably, the described technique may be applied to processing such as oxidizing, diffusion processing, annealing processing, etching processing on for example, the wafer W, the film formed on the wafer W or the like.

The above-described embodiments or modifications may be appropriately combined and used. In this case, the process conditions may be, for example, the same as process conditions of the above-described embodiments or modifications.

According to the described technique, a heating-up time of a process chamber can be reduced.

What is claimed is:
1. A substrate processing apparatus comprising:
a reaction tube defining a process chamber, wherein the process chamber comprises: a process region where a substrate is processed; and a thermal insulating region under the process region, and the reaction tube comprises: a gas exhaust space that protrudes toward an outside of the reaction tube; a first exhaust provided on a partition between the gas exhaust space and a side of the process region and configured to laterally exhaust an atmosphere of the process region; a second exhaust provided discontinuously to the first exhaust on a partition between the gas exhaust space and the thermal insulating region and disposed at a height corresponding to the thermal insulating region and configured to exhaust an atmosphere of the thermal insulating region;

and a gas exhaust port that communicates with the gas exhaust space and configured to connect the reaction tube to an exhaust pipe;
a substrate retainer configured to support the substrate in the process region of the process chamber;
a process gas supply unit configured to supply a process gas into the process chamber;
a heater installed in the thermal insulating region and configured to heat the substrate;
a thermal insulating unit disposed under the substrate retainer and comprising a cylinder accommodating the heater; and
a purge gas supply pipe and a purge gas supply valve communicating with a purge gas supply port, the purge gas supply port opens inside the cylinder of the thermal insulating unit and is configured to be able to supply a purge gas and expose the heater to the purge gas, the purge gas supply port is formed as a ring-shaped opening and disposed in the thermal insulating unit at a height higher than that of the second exhaust.

2. The substrate processing apparatus of claim 1, wherein the first exhaust comprises a plurality of gas exhaust slits corresponding to a plurality of substrates including the substrate, and
an opening area of the second exhaust is greater than that of each of the plurality of gas exhaust slits but is smaller than a total opening area of the plurality of gas exhaust slits.

3. The substrate processing apparatus of claim 2, wherein the thermal insulating unit further comprises insulating discs including at least one reflective disc or at least one thermal insulation disc that are accommodated in the cylinder, and
wherein the heater comprises a heater wire disposed below the substrate and above one of the insulating discs inside the thermal insulating unit and configured to heat the substrates from below.

4. The substrate processing apparatus of claim 1, further comprising:
a support member supporting a thermal insulating disc; and
a base member fixed to an upper end of a rotary shaft and supporting the support member.

5. A method of manufacturing a semiconductor device using the apparatus of claim 1, comprising:
(a) placing the substrate on the substrate retainer; and
(b) processing the substrate while supplying the process gas into the process chamber with the process gas supply unit, wherein in the step (b), an inside of the thermal insulating unit is purged with the purge gas from the purge gas supply port.

6. The substrate processing apparatus of claim 1, wherein the reaction tube further comprises a flange that protrudes toward the outside of the reaction tube at a lower end of the reaction tube, and
wherein the gas exhaust space connects with the flange and extends to an upper end of the reaction tube.

7. The substrate processing apparatus of claim 1, wherein the reaction tube further comprises a nozzle connected to the process gas supply unit and extended in a direction in which a plurality of substrates including the substrate are stacked, the nozzle comprising gas supply holes through which a gas is supplied toward the substrates.

8. The substrate processing apparatus of claim 1, wherein the process gas supply unit comprises:
a first gas supply pipe connected to a nozzle and configured to supply at least one of a source gas and a reaction gas;
a first mass flow controller configured to control a flow through the first gas supply pipe;
a first valve serving as an opening and closing valve;
a second gas supply pipe connected to a downstream side of the first gas supply pipe and configured to supply an inert gas;
a second mass flow controller; and
a second valve.

9. The substrate processing apparatus of claim 1, further comprising a gas supply space protruding toward the outside of the reaction tube so as to face the gas exhaust space wherein the gas supply space and the gas exhaust space are on an outside of the process chamber, wherein the process chamber and the gas supply space are divided by a partition,
wherein the reaction tube further comprises a nozzle provided in the gas supply space to be connected to the process gas supply unit and extended in a direction in which a plurality of substrates including the substrate are stacked, the nozzle comprising gas supply holes through which a gas is supplied toward the substrates.

10. The substrate processing apparatus of claim 4, further comprising exhaust holes located at a lower portion of the thermal insulating unit lower than the second exhaust and configured to discharge the purge gas from the thermal insulating unit into the process chamber.

11. The substrate processing apparatus of claim 10, wherein the cylinder has a closed upper end and the exhaust holes are formed at a bottom of the thermal insulating unit.

12. The substrate processing apparatus of claim 6, further comprising a manifold provided under the flange and having a diameter greater than that of an inner wall of the reaction tube and forming an annular space inside the manifold and under the flange.

13. The substrate processing apparatus of claim 1, further comprising exhaust holes located at a lower portion of the thermal insulating unit on a side of the insulating region which is opposite to the second exhaust and configured to discharge the purge gas from the thermal insulating unit into the process chamber,
wherein an upper end of the second exhaust is higher than an upper end of the gas exhaust port, and a lower end of the second exhaust is higher than a lower end of the gas exhaust port.

14. The substrate processing apparatus of claim 1, wherein the cylinder has a diameter greater than that of the substrate and a gap between the reaction tube and the cylinder is set within a range from 7.5 mm to 15 mm.

15. The substrate processing apparatus of claim 10, wherein the purge gas is supplied into an inner space of the thermal insulating unit from an upper portion of the inner space of the thermal insulating unit at a first location below the heater and exits the inner space at a second location below the first location, the first location being an upper end of a space between a pillar of the heater and the support member and the second location corresponding with the exhaust holes, and
wherein the purge gas suppresses a formation of a film on the heater.

16. A substrate processing apparatus comprising:
a reaction tube defining a process chamber, wherein the process chamber comprises: a process region where a substrate is processed; and a thermal insulating region under the process region, and the reaction tube comprises: a gas exhaust space that protrudes toward an outside of the reaction tube; a first exhaust provided on a partition between the gas exhaust space and a side of the process region and configured to laterally exhaust an atmosphere of the process region; a second exhaust provided discontinuously to the first exhaust on a partition between the gas exhaust space and the thermal insulating region and disposed at a height corresponding to the thermal insulating region and configured to exhaust an atmosphere of the thermal insulating region; and a gas exhaust port that communicates with the gas exhaust space and configured to connect the reaction tube to an exhaust pipe;

a substrate retainer configured to support the substrate in the process region of the process chamber;

a process gas supply unit configured to supply a process gas into the process chamber;

a heater installed in the thermal insulating region and configured to heat the substrate;

a thermal insulating unit disposed under the substrate retainer and comprising: a cylinder and insulating discs including at least one reflective disc or at least one thermal insulation disc that are accommodated in the cylinder; and a purge gas supply port that opens inside the cylinder of the thermal insulating unit and is configured to be able to supply a purge gas that purges that process gas from an inside of the thermal insulating unit, wherein the second exhaust partially overlaps with the gas exhaust port, an upper end of the second exhaust is lower than an uppermost one of the insulating discs and higher than a lower end of the reaction tube, and a lower end of the second exhaust is lower than an upper end of the gas exhaust port and higher than a lowermost one of the insulating discs.

* * * * *